US008581343B1

(12) United States Patent
Desbiens et al.

(10) Patent No.: US 8,581,343 B1
(45) Date of Patent: Nov. 12, 2013

(54) ELECTRICAL CONNECTIVITY FOR CIRCUIT APPLICATIONS

(75) Inventors: Donald J. Desbiens, Yarmouth, ME (US); Gary D. Polhemus, Sebago, ME (US); Robert T. Carroll, Andover, MA (US)

(73) Assignee: International Rectifier Corporation, El Segundo, CA (US)

( * ) Notice: Subject to any disclaimer, the term of this patent is extended or adjusted under 35 U.S.C. 154(b) by 374 days.

(21) Appl. No.: 12/830,828

(22) Filed: Jul. 6, 2010

(51) Int. Cl.
*H01L 29/76* (2006.01)
*H01L 23/48* (2006.01)

(52) U.S. Cl.
USPC ........... 257/341; 257/343; 257/401; 257/758; 438/122

(58) Field of Classification Search
USPC ........... 257/401, E21.509, E23.141, E23.031, 257/676; 438/122
See application file for complete search history.

(56) References Cited

U.S. PATENT DOCUMENTS 5,598,029 A * 1/1997 Suzuki .......................... 257/665
6,373,125 B1 4/2002 Pannaccione et al.
6,462,522 B2 * 10/2002 Burstein et al. ............... 323/282
6,482,680 B1 11/2002 Khor et al.
6,713,823 B1 * 3/2004 Nickel .......................... 257/401
6,972,464 B2 * 12/2005 Shen ............................ 257/368
7,928,567 B2 * 4/2011 Van De Weil et al. ........ 257/750
7,933,133 B2 * 4/2011 Shepard et al. ................ 365/51
7,944,048 B2 * 5/2011 Jiang ............................ 257/737
7,964,916 B2 * 6/2011 Or-Bach et al. ............... 257/347
8,085,553 B1 * 12/2011 Lacap et al. .................. 361/813
8,169,081 B1 * 5/2012 Jergovic et al. ............... 257/773
2011/0241125 A1 * 10/2011 Rader et al. .................. 257/401

* cited by examiner

*Primary Examiner* — Andy Huynh
*Assistant Examiner* — David Goodwin
(74) *Attorney, Agent, or Firm* — Chapin IP Law, LLC

(57) ABSTRACT

According to example configurations herein, a leadframe includes a first conductive strip, a second conductive strip, and a third conductive strip disposed substantially adjacent and substantially parallel to each other. A semiconductor chip substrate includes a first array of switch circuits disposed adjacent and parallel to a second array of switch circuits. Source nodes in switch circuits of the first array are disposed substantially adjacent and substantially parallel to source nodes in switch circuits of the second array. When the semiconductor chip and the leadframe device are combined to form a circuit package, a connectivity interface between the semiconductor chip and conductive strips in the circuit package couples each of the source nodes in switch circuits of the first array and each of the multiple source nodes in switch circuits of the second array to a common conductive strip in the leadframe device.

4 Claims, 24 Drawing Sheets

BOTTOM VIEW OF LEADFRAME DEVICE
140-5
140-4
140-3
ELECTRICALLY NON-CONDUCTIVE FILLER 825
140-2
345-2
140-1
PADS 850
345-1
11
10
9
8
7
6

ELECTRICAL CONNECTIVITY FOR CIRCUIT APPLICATIONS

BACKGROUND

Surface-mount technology (SMT) provides a way of interconnecting electronic circuit components with each other. For example, according to such technology, electronic devices are specifically packaged for mounting directly on a respective surface of a printed circuit board. Because of the advantages associated with surface mount technology such as smaller part size, surface mount technology has, to a large extent, replaced through-hole technology in which wire leads of components are fitted and soldered into holes of a printed circuit board to provide connectivity.

Surface mount devices come in a variety of styles. For example, a surface mount device can have relatively small leads or no leads extending from the package at all. Because a surface mount device has relatively small leads or no leads at all, a surface mount device is usually smaller than its through-hole counterpart. The surface mount device may have short pins or leads of various styles, flat contacts, a matrix of solder balls (such as Ball Grid Arrays), or terminations on the body of the component.

One type of electronic circuit that can be packaged in a surface mount device is a so-called integrated circuit or semiconductor chip. The integrated circuit can provide a variety of functionality depending on how the integrated circuit (e.g., chip) is designed.

For example, in a specific application, an integrated circuit can include one or more arrays of small transistors that are interconnected in parallel with respect to each other based solely on metal layers (e.g., conductive paths) in the integrated circuit. Connecting multiple small transistors of an integrated circuit in parallel via the corresponding layers of metal effectively can produce a single transistor supporting high current drive and low impedance switching capability.

In certain other applications, transistors can be obtained as discrete components (e.g., individual electrical parts) and connected in parallel with each other via respective traces on a circuit board. As is the case for multiple transistors connected in parallel via the metal layers in an integrated circuit, a set of multiple transistors in parallel with each other on a circuit board can provide higher current sinking and sourcing capability.

BRIEF DESCRIPTION

Conventional applications such as those as discussed above can suffer from a number of deficiencies. For example, a conventional switch circuit derived from an array of small transistors in an integrated circuit can require tens, hundreds, or even more transistors connected in parallel via metal layers in the integrated circuit to produce a single effective, functional transistor. Connecting multiple transistors in parallel can be quite complex due to the number of individual transistors that must be interconnected. For example, each transistor in the array can have a corresponding gate, source, and drain. To connect the transistors in parallel and form a single effective transistor device, the integrated circuit must connect all of the gates to each other, all of the sources to each other, and all of the drains to each other. Providing conventional connectivity to connect a set of transistors in parallel, according to conventional techniques, requires a complex metal interconnect potentially including many layers.

As is known, the transistors in such a device as well as corresponding metal interconnect layers of the integrated circuit are very small and thus difficult and expensive to manufacture. Even if it is possible to manufacture such devices, the complexity of the metal interconnect layers of the integrated circuit means that the device is more likely prone to failure or low manufacture yields. Additionally, when used, the metalization layers in an integrated circuit are usually not thick enough to provide a very low impedance path. This results in unwanted losses.

Embodiments herein deviate with respect to conventional applications. For example, embodiments herein are directed to a unique way of providing interconnectivity of circuitry such as transistors in a leadframe device.

More specifically, one embodiment herein includes a circuit package including a leadframe, a semiconductor chip, and a connectivity interface. As its name suggests, the connectivity interface provides connections between the semiconductor chip and the leadframe. For example, in one embodiment, the leadframe comprises: a first conductive strip, a second conductive strip, and a third conductive strip disposed substantially adjacent and parallel to each other.

The semiconductor chip substrate can include a first array of switch circuits disposed adjacent and parallel to a second array of switch circuits. Primary nodes such as source nodes in switch circuits of the first array can be disposed substantially adjacent and substantially parallel to primary nodes in switch circuits of the second array.

In a further specific embodiment, each array of switch circuits can include a row of source nodes and a row of drain nodes. The row of the source nodes in the first array and the row of source nodes in the second array can be disposed between the row of drain nodes in the first array and the row of drain nodes in the second array. The connectivity interface of the circuit package couples each of the source nodes in switch circuits of the first array and each of the multiple source nodes in switch circuits of the second array to a single conductive strip such as the second conductive strip. The second conductive strip can therefore be a common source node for source nodes in transistors of the first array and transistors of the second array.

When the leadframe is installed on a circuit board, the second conductive strip of the circuit package provides connectivity between the source nodes and a connection point on to a host substrate such as a printed circuit board. Disposing the row of source nodes in the first array next to the row of source nodes in the second array can reduce an overall pin or pad count of the circuit package as parallel and adjacent rows of source nodes in relatively close proximity to each other can be connected to a common conductive strip in the leadframe as opposed to multiple conductive strips in the leadframe. Thus, when the leadframe is installed on a circuit board, the second conductive strip of the circuit package provides connectivity between the source nodes in the first and second arrays and a connection point on a host substrate such as a printed circuit board.

In further embodiments, the connectivity interface in the circuit package can provide connectivity between the drain nodes in the first array and the first conductive strip. Thus, the first conductive strip can be a common drain node. When the leadframe is installed on a circuit board, the first conductive strip of the circuit package provides connectivity between the drain nodes in the first array and a connection point on the host substrate.

Also, the connectivity interface in the circuit package can provide connectivity between the drain nodes in the second array and the third conductive strip. Thus, the third conductive strip also can be a common drain node. When the leadframe is installed on a circuit board, the third conductive strip of the circuit package provides connectivity between the drain nodes in the second array and a connection point on the host substrate.

By way of a non-limiting example, prior to making the connection between the array of switch circuits and the conductive strips, each of the source nodes can be electrically isolated from each other, each of the drain nodes in a respective transistor circuit tile can be electrically isolated from each other, etc. Subsequent to making connection of the electrical circuit with the connectivity interface in the leadframe, the respective conductive strip in the leadframe electrically connects the source nodes together. Accordingly, embodiments herein include a way of utilizing a connectivity interface in a leadframe to provide connectivity between nodes of an electrical circuits in lieu of having to provide such connectivity at, for example, an on-chip metal interconnect layer of an integrated circuit device.

As briefly discussed above, in addition to a first connectivity interface connecting the circuit to one or more conductive strip, the circuit package as discussed herein can also include a second connectivity interface (such as pins, pads, etc.) for electrically attaching the conductive strips in the circuit package to a host substrate such as a circuit board.

Although any reasonable configuration is possible, according to one embodiment, the first connection interface resides on a first facing of the leadframe and the second connectivity interface resides on a second facing of the leadframe. The conductive strips in the leadframe provide paths on which to connect nodes of the semiconductor chip to nodes on a respective circuit board.

Embodiments herein further include a packaged circuit device comprising: a conductive strip and a semiconductor chip substrate including a first array of switch circuits disposed substantially adjacent and substantially parallel to a second array of switch circuits. A first connectivity interface of the conductive strip couples switch circuits in the first array and switch circuits in the second array to the conductive strip. A second connectivity interface of the conductive strip can be configured to electrically couple the conductive strip in the packaged circuit to an electrical node of a host circuit substrate.

Embodiments herein further include a novel integrated circuit device. The integrated circuit device can comprise a first array of switch circuits and a second array of switch circuits. The first array of switch circuits can be disposed on a semiconductor chip substrate. Each switch circuit in the first array can include a source node and a drain node. The second array of switch circuits also can be disposed on the semiconductor chip substrate. Each switch circuit in the second array can include a source node and a drain node. Source nodes in switch circuits of the first array can be disposed on the semiconductor chip substrate to be adjacent and in close proximity to source nodes in switch circuits of the second array. Accordingly, the source nodes in the first array and the second array can be easily connected to a common connectivity region of a conductive strip on the leadframe device.

In yet further embodiments as discussed herein, an integrated circuit device can include: a semiconductor layer, multiple interconnect layers, a first conductive layer and a second conductive layer. The semiconductor conductive layer can be fabricated to include multiple transistors. The multiple interconnect layers connect the multiple transistors in parallel with each other. The first conductive layer electrically can be electrically coupled to the multiple transistors via the multiple interconnect layers. The first conductive layer can be a material having a first resistivity. The second conductive layer can be electrically coupled to the first conductive layer. The second conductive layer can be a material having a second resistivity, the second resistivity being less than the first resistivity. Because the second conductive layer is a lower resisitivity, it can provide a better conductive path between, for example, transistors in the semiconductor layer and a conductive strip in the leadframe to which the conductive layers are electrically connected.

These and other more specific embodiments are disclosed in more detail below.

The embodiments as described herein are advantageous over conventional techniques. For example, the leadframe device according to embodiments herein provides unique connectivity in a circuit package, alleviating the complexity of connectivity provided in metal interface layer(s) of an integrated circuit device.

It is to be understood that the system, method, apparatus, etc., as discussed herein can be embodied strictly as hardware, as a hybrid of software and hardware, or as software alone such as within a processor, or within an operating system or a within a software application. Example embodiments of the invention may be implemented within products and/or software applications such as those developed or manufactured by CHiL Semiconductor of Tewksbury, Mass., USA.

As discussed above, techniques herein are well suited for use in leadframe packaging applications. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

As further discussed below, different embodiments herein support: 1) reducing a pin count of leadframe semiconductor chip, 2) use of conductive paths in a leadframe device to provide interconnects between transistor modules to enable the use of thick top layer metal (in other layers of a semiconductor device) to be used for control purposes such as a low impedance gate interconnect that enables a centralized driver circuit which simplifies a leadframe design, further enhancing scalability; 3) size matching of chip transistor modules with respect to a leadframe strip pitch in a leadframe device; 4) unique connectivity between circuits on an integrated circuit and circuit board to which the leadframe is attached; and so on.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

Figure 1:
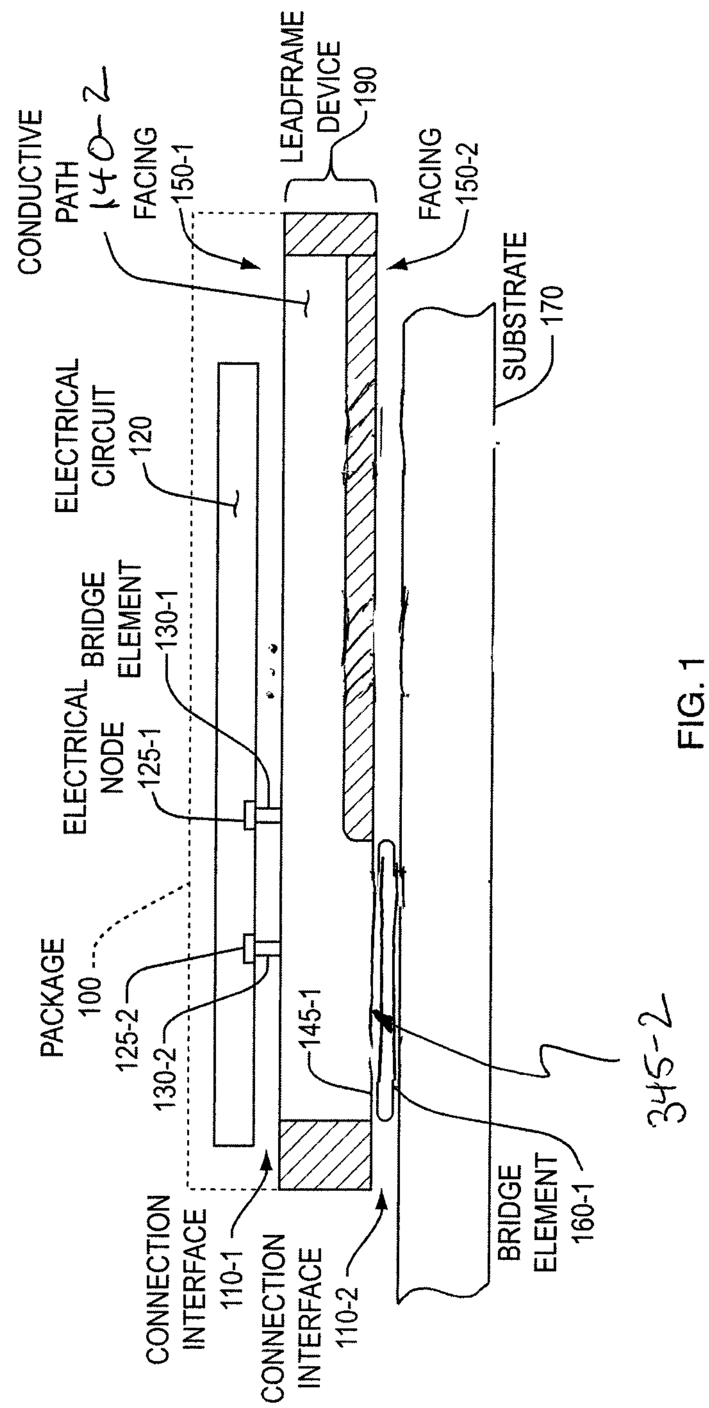
FIG. 1 is an example side view diagram of a leadframe package and respective leadframe package components according to embodiments herein.

FIG. 1 is an example diagram illustrating interconnectivity of an electrical circuit 120, leadframe device 190, and substrate 170 according to embodiments herein.

As shown, one embodiment herein includes a leadframe device 190 comprising a connection interface 110-1. The connection interface 110-1 can be configured for electrically attaching or coupling electrical circuit 120 such as a semiconductor chip, integrated circuit, etc., to the leadframe device 190.

The leadframe device 190 includes one or more conductive paths including conductive path 140-2. The conductive path 140-2 (e.g., conductive strip) has a contact region on facing 150-1 of the leadframe device 190 and provides a contact region in which to make an electrical connection between electrical node 125-1 of the electrical circuit 120 and electrical node 125-2 (e.g., a source node, drain node, etc.) of the electrical circuit 120. Electrical node 125-1 can be an exposed metallic region or contact on a facing of the electrical circuit 120.

In one embodiment, prior to making the connection between the electrical nodes 125-1, 125-2, . . . of electrical circuit 120 and the contact region of the conductive path 140 in the leadframe device 190, the electrical node 125-2 and the electrical node 125-1 are electrically isolated from each other. In other words, by way of a non-limiting example, and in accordance with one embodiment, the electrical nodes 125 are not electrically connected with respect to each other by virtue of a metal interconnect on the electrical circuit 120.

Subsequent to making connection of the electrical circuit 120 with the leadframe device 190 via conductive bridge elements 130, the conductive path 140-1 of the leadframe device 190 electrically connects the electrical node 125-2 and the electrical node 125-1 together. Bridge elements 130 can be pillars, posts, or other suitable shape formed from conductive material.

In one embodiment, the conductive bridge element 130-1 electrically connects the electrical node 125-1 to the conductive path 140-2, the conductive bridge element 130-2 electrically connects the electrical node 125-2 to the conductive path 140-2, and so on.

As mentioned, the conductive bridge element 130 can take on any of a number of different forms. For example, in one embodiment, the conductive bridge element 130 is a pillar made of conductive material.

The pillar or other suitably shaped bridge element 130 can be formed on a surface of the electrical circuit 120 by depositing a metal layer on the electrical circuit 120 and then etching away a portion of the deposited metal layer.

As shown, circuit 120 can include multiple electrical nodes 125 that are initially electrically isolated from each other but which became attached together via a low impedance path after nodes such as 125-1, 125-2, are electrically connected to conductive path 140-1.

In one embodiment, the conductive path 140-2 is a conductive strip disposed in the leadframe device 190 to electrically connect the isolated nodes of circuit 120 together as well as connect such nodes to substrate 170. The leadframe device 190 can include one or more conductive strips disposed as discussed herein and parallel to each other.

In accordance with another embodiment, the bridge elements 130 or pillars are plated up after a mask is applied. This is a selective plating process as opposed to a selective etching. Either approach could be used to produce the bridge elements 130.

In further embodiments, note that a conductive material such as solder can be used to connect the pillars (conductive bridge elements) to a respective conductive strip or conductive path 140-2 in the leadframe device 190.

In one embodiment, the conductive bridge elements 130 are made from copper, although any suitable metal or conductive material can be used to provide such functionality.

Thus, in an example embodiment, the electrical node 125-1 can be electrically coupled to a pillar of conductive material for connecting a first portion of the electrical circuit 120 to the conductive path 140-2 of the leadframe device 190. The electrical node 125-2 can be electrically connected to a second pillar of conductive material for connecting a second portion of the electrical circuit 120 to the conductive path 140-2 of the leadframe device 190. Again, the conductive bridge elements 130 can be made of copper or other suitable conductive material.

According to other alternative embodiments, note that the conductive bridge elements 130 can be solder balls that connect respective electrical nodes 125 of the electrical circuit 120 to the conductive path 140-2.

The electrical circuit 120 can be an integrated circuit such as a semiconductor chip. The electrical nodes 125 can emanate from a single electrical circuit 120 fabricated on a common semiconductor substrate. The electrical circuit 120 can thus be a semiconductor chip cut from a wafer.

In alternative embodiments, the electrical circuit 120 can include a number of semiconductor chips that are packaged into the same leadframe package 100.

The embodiments in FIG. 1 illustrate a technique of utilizing a leadframe device 190 or leadframe package to provide off-chip connectivity between electrical nodes 125 of an electrical circuit 120 in lieu of having to provide such connectivity at, for example, a metal interconnect layer of the integrated circuit device. In other words, the conductive strips or conductive paths 140 in the leadframe device 190 can provide connectivity of two or more circuits in the electrical circuit 120. As will be discussed later in this specification, connectivity provided by the leadframe device can be used to connect, in parallel, two or more electrically isolated circuits in the electrical circuit 120.

As shown, the leadframe device 190 can also include a second connection interface 110-2 for attaching the leadframe device 190 to a substrate 170 such as a printed circuit board, flex-board, etc. Conductive bridge element 160-1 such as solder can provide electrical connectivity between the contact element 345-2 (e.g., surface pad) of conductive path 140-2 and a respective one or more traces on the substrate 170.

As shown, contact elements 345 and conductive paths 140 in the leadframe device 190 can be separated from each other via electrically non-conductive material such as a plastic filler of the leadframe package 100. The cross-hatched region in the side view of the leadframe device indicates non-conductive material.

To summarize the details of leadframe device 190 as shown in FIG. 1, although any reasonable configuration is possible, according to one embodiment, the first connection interface 110-1 resides on a first facing 150-1 of the leadframe device 190 and the second connectivity interface 110-2 resides on a second facing 150-2 of the leadframe device 190. By way of a non-limiting example, the first facing 150-1 and the second facing 150-2 of the leadframe device 190 can be disposed on opposite sides of the leadframe device 190 with respect to each other, adjacent sides of the leadframe, same side of the leadframe, etc.

One way to produce the leadframe device 190 is to start out with a slab of metal, such as copper, of appropriate thickness. The copper can be etched or machined to remove metal between the conductive paths 140 or lengths of conductive strips so that each of the conductive paths 140 are electrically independent of each other. In other words, according to one embodiment, the conductive paths 140 in leadframe device 190 need not be electrically connected to each other internal to the leadframe device 190.

Further machining can be performed at axial ends of the conductive paths 140 to fit the conductive paths 140 within the leadframe device 190. Since it may be desirable to have spaced surfaces, as in related FIG. 8 (top down view), portions of each of one or more of the conductive paths 140 on facing 150-2 can be etched and filled in with a non-conductive material such as plastic so that pads or contact elements are spaced and electrically isolated from each other.

A non-conductive material, such as plastic, can be used to fill in between the conductive paths 140 and above and around circuit 120 so as to produce package 100 and protect the electrical circuit from adverse environmental conditions.

Note that the inclusion of a respective contact element 345 (or pads of the leadframe device 190) on each of one or more of the conductive paths 140 is shown by way of non-limiting example only and that a respective conductive path need not include a surface in which to attach to a host substrate 170. In other words, the conductive path 140-2 or the like may provide connectivity between nodes of the electrical circuit 120 without feet or a pad area for connecting the nodes to a host circuit board. Accordingly, the respective conductive path can be used as a way of connecting nodes of electrical circuit 120 at a layer other than in a metalization layer of an integrated circuit such as circuit 120. In this latter embodiment, when the leadframe device 190 is attached to a host substrate 170, the respective conductive path does not attach to the substrate.

Figure 2:
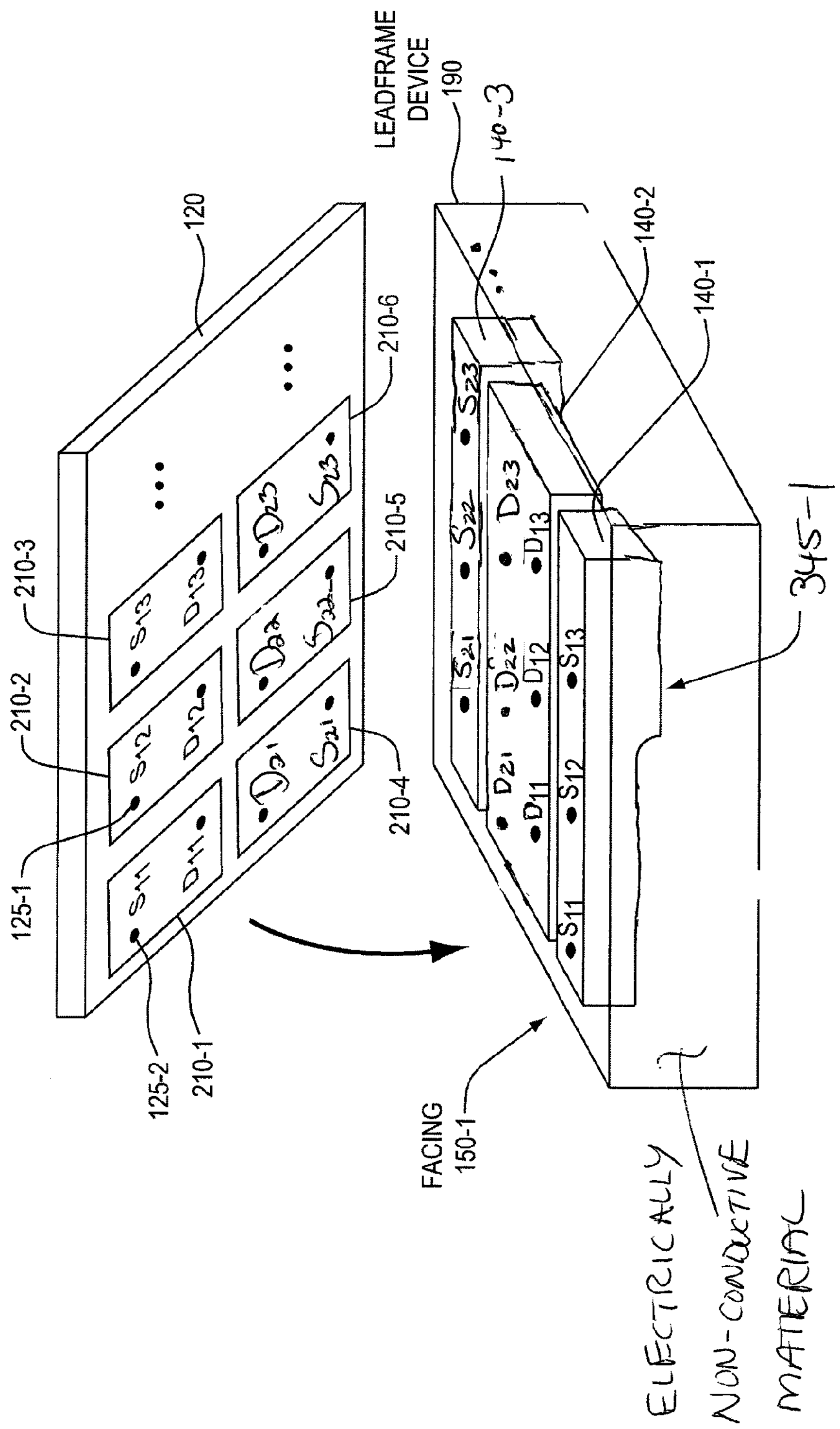
FIG. 2 is an example 3-D diagram illustrating coupling of an electrical circuit to conductive strips in a corresponding leadframe according to embodiments herein.

FIG. 2 is an example 3-D diagram illustrating how an electrical circuit 120 is coupled to a leadframe device 190 according to embodiments herein.

As shown, the exposed side of electrical circuit 120 having exposed electrical nodes 125 (e.g., electrical node 125-1, electrical node 125-2, etc.) is attached to the facing 150-1 of the leadframe device 190.

In one embodiment, the electrical circuit 120 is a substantially planar-shaped device (such as an integrated circuit, semiconductor device, etc.) including multiple independent circuits 210 (e.g., circuit 210-1, circuit 210-2, circuit 210-3, circuit 210-4, circuit 210-5, circuit 210-6, . . . ) spread out about a surface of the electrical circuit 120 (e.g., planar shaped device).

Each circuit 210 can represent a transistor tile circuit having at least a source node and a drain node. The transistor tile circuit can comprise multiple individual transistors connected in parallel with each other via an interconnect layer associated with the circuit tile.

A size associated with leadframe device 190 and corresponding electrical circuit 120 is highly scalable. For example, a number of rows and/or columns of circuits 210 residing on electrical circuit 120 and connected in parallel can be varied to create switches or transistor tiles having different sinking/sourcing capabilities. In such embodiments when the row and/or columns of circuits 210 is adjusted, the size of leadframe device 190 and number of conductive paths 140 in the leadframe device 190 can be adjusted to match the number of rows and columns of circuits 210 of electrical circuit 120. An example of adjusting rows and columns of circuits 210 is shown and discussed with respect to FIG. 4B.

Referring again to FIG. 2, each of the electrical circuits 210 of circuit 120 can have one or more inputs and/or one or more outputs that are electrically independent of each other. For example, in furtherance of the embodiment as discussed above, electrical circuit 120 can be an array of switch tiles (e.g., circuits 210), each of which has a respective source node and drain node that are not initially attached to sources and drains of any of the other electrical circuits 210 in electrical circuit 120. In other words, the respective source nodes and drain nodes of each circuit 210 can be electrically isolated from each other except for the electrical connection provided by the conductive path 140-2 in the leadframe device 190 when so connected. Thus, in one example embodiment, each of the conductive paths 140 is electrically independent until the leadframe device 190 is electrically attached to a circuit board substrate.

As discussed later in this specification, the circuit substrate (to which the leadframe device 190 is attached) can include additional conductive paths that provide connectivity amongst the conductive paths 140 in the leadframe device 190.

In one embodiment, each of the circuits 210 is a switch circuit as will be discussed later in this specification. Connection of the circuits 210 to the conductive paths 140 connects the circuits 210 in parallel. For example, circuits 210-1, 210-2, and 210-3 can be connected in parallel with each other when respective source nodes $S_{11}$, $S_{12}$, and $S_{13}$ are connected to conductive path 140-1 and drain nodes $D_{11}$, $D_{12}$, and $D_{13}$ are connected to conductive path 140-2 as discussed below. A common gate signal can be connected to drive respective gate nodes of the circuits 210 connected in parallel.

Contact element 345-1 or exposed surface of the conductive path 140-1 (e.g., one or more surfaces on facing 150-2 of leadframe device 190) provides connectivity with respect to a substrate such as a printed circuit board or other interconnecting device.

The conductive paths 140 (e.g., conductive path 140-1, conductive path 140-2, conductive path 140-3, conductive path 140-4, etc.) can provide connectivity between the multiple electrically independent circuits 210 and, optionally, provide connectivity through the leadframe device 190 to the substrate 170. For example, as shown, the facing of electrical circuit 120 having exposed node contacts (e.g., $S_{11}$, $S_{12}$, . . . , $D_{11}$, $D_{12}$, . . . ) can be pressed or moved into communication of the facing 150-1 of the leadframe device 190 to connect the electrical nodes 125 (e.g., node $S_{11}$, $S_{12}$, . . . , $D_{11}$, $D_{12}$, . . . ) to corresponding locations on the conductive paths 140 as indicated.

More specifically, when electrical circuit 120 is moved into communication with facing 150-1 of the leadframe device 190 as shown, electrical node 125-2 (e.g., source node $S_{11}$) of circuit 210-1 comes in contact with the location labeled $S_{11}$ on conductive path 140-1; electrical node 125-1 (e.g., source node $S_{12}$) of circuit 210-2 comes in contact with the location labeled $S_{12}$ on conductive path 140-1; electrical node labeled source node $S_{13}$ in circuit 210-3 comes in contact with the location labeled $S_{13}$ on conductive path 140-1; and so on. Thus, the conductive path 140-1 of leadframe device 190 can provide "off-chip" connectivity with respect to a first set of electrical nodes in the electrical circuit 120.

In accordance with the above embodiment, when electrical circuit 120 is moved in communication with facing 150-1, electrical node labeled drain node $D_{11}$ of circuit 210-1 comes in contact with the location labeled $D_{11}$ on conductive path 140-2; electrical node labeled drain node $D_{12}$ of circuit 210-2 comes in contact with the location labeled $D_{12}$ on conductive path 140-2; electrical node labeled drain node $D_{13}$ in circuit 210-3 comes in contact with the location labeled $D_{13}$ on conductive path 140-1; and so on. Thus, the conductive path 140-2 of leadframe device 190 can be configured to provide off-chip connectivity with respect to a second set of electrical nodes in the electrical circuit 120.

Additionally, when electrical circuit 120 is seated onto facing 150-1, electrical node labeled drain node $D_{21}$ of circuit 210-4 comes in contact with the location labeled $D_{21}$ on conductive path 140-2; electrical node labeled drain node $D_{22}$ of circuit 210-5 comes in contact with the location labeled $D_{22}$ on conductive path 140-2; electrical node labeled drain node $D_{23}$ in circuit 210-6 comes in contact with the location labeled $D_{23}$ on conductive path 140-2; and so on. Thus, the conductive path 140-2 of leadframe device 190 can be configured to provide off-chip connectivity amongst a row of drain nodes in a first array of circuits including circuits 210-1, 210-2, and 210-3 as well as a row of drain nodes in a second array of circuits including circuits 210-4, 210-5, and 210-6.

Additionally, when electrical circuit 120 is moved in communication with facing 150-1, electrical node labeled drain source node $S_{21}$ of circuit 210-4 comes in contact with the location labeled $S_{21}$ on conductive path 140-3; electrical node labeled source node $S_{22}$ in circuit 210-5 comes in contact with the location labeled $S_{22}$ on conductive path 140-3; electrical node labeled source node $S_{23}$ in circuit 210-6 comes in contact with the location labeled $S_{23}$ on conductive path 140-3; and so on. Thus, even before mounting of the leadframe device 190 to a circuit board, the conductive path 140-3 of leadframe device 190 can provide "off-chip" connectivity with respect to a row of source nodes.

In further embodiments, it can be seen that at least a portion of each respective conductive path 140 in the leadframe device 190 can be substantially orthogonal with respect to a plane of the planar-shaped device (e.g., electrical circuit 120) on which the multiple circuits 210 reside. In other words, according to one embodiment, the conductive paths provide connectivity to a host substrate in a direction orthogonal to a plane of the electrical circuit 120 to a host substrate.

Thus, according to FIG. 2, a circuit package can include a leadframe device 190. The leadframe device 190 can include a first conductive strip (e.g., conductive path 140-1), a second conductive strip (e.g., conductive path 140-2), and a third conductive strip (e.g., conductive path 140-3) disposed substantially adjacent and substantially parallel to each other. The electrical circuit 120, such as a semiconductor chip substrate, can include a first array of switch circuits (e.g., a combination of circuits 210-1, 210-2, and 210-3) disposed adjacent and parallel to a second array of switch circuits (e.g., a combination of circuits 210-4, 210-5, and 210-6.

Drain nodes ($D_{11}$, $D_{12}$, and $D_{13}$) in switch circuits of the first array are disposed to face and be substantially adjacent and substantially parallel to drain nodes ($D_{21}$, $D_{22}$, and $D_{23}$) in switch circuits of the second array of tiles. An exposed region of conductive path 140-2 on facing 150-1 provides a connectivity interface or common node coupling each of the drain nodes in switch circuits of the first array and each of the multiple drain nodes in switch circuits of the second array.

Thus, according to one embodiment herein, the row of drain nodes ($D_{11}$, $D_{12}$, and $D_{13}$) of the first array of circuits and the row of drain nodes ($D_{21}$, $D_{22}$, and $D_{23}$) of the second array of circuits are disposed to be closer in proximity to each other than a row of source nodes ($S_{11}$, $S_{12}$, and $S_{13}$) in the first array and a row of source nodes ($S_{21}$, $S_{22}$, and $S_{23}$) in the second array. Said differently, according to one embodiment, the row of drain nodes ($D_{11}$, $D_{12}$, and $D_{13}$) in the first array and the row of drain nodes ($D_{21}$, $D_{22}$, and $D_{23}$) in the second array are disposed or sandwiched between a row of source nodes ($S_{11}$, $S_{12}$, and $S_{13}$) of the first array and a row of source nodes ($S_{21}$, $S_{22}$, and $S_{23}$) of the second array.

Because the drain nodes in the two arrays face each other and can be connected to a common node such as conductive path 140-2, fewer conductive paths are needed in the leadframe device 190. For example, according to one embodiment, reducing the number of conductive paths 140 (e.g., one conductive path for to rows of drain nodes) in leadframe device 190 can reduce an overall number of pins in the leadframe device 190 that need to be attached to a circuit substrate, thus increasing circuit reliability. Recall that a surface of the conductive path becomes a pad for connecting to a circuit board.

Of course, embodiments herein further include an electrical circuit having any number of arrays of circuits in which the pattern and orientation of source nodes and drains nodes is alternated such that rows of source nodes from one array of circuits to the next face each other and rows of drain nodes from one array of circuits to the next face each other.

Note that FIG. 2 further illustrates a connectivity interface coupling each of the source nodes ($S_{11}$, $S_{12}$, and $S_{13}$) in circuits of the first array to the conductive strip or conductive path 140-1 and a connectivity interface coupling each of the source nodes ($S_{21}$, $S_{22}$, and $S_{23}$) in switch circuits of the second array to the conductive strip or conductive path 140-4.

As previously discussed, each of the conductive paths or strips in the leadframe device 190 can be electrically isolated from each other. For example, the conductive path 140-1 can be electrically isolated from conductive path 140-3. Conductive path 140-1 and conductive path 140-3 can be electrically connected to each other via a trace on a host circuit board to which the leadframe device or circuit package is mounted.

Figure 3:
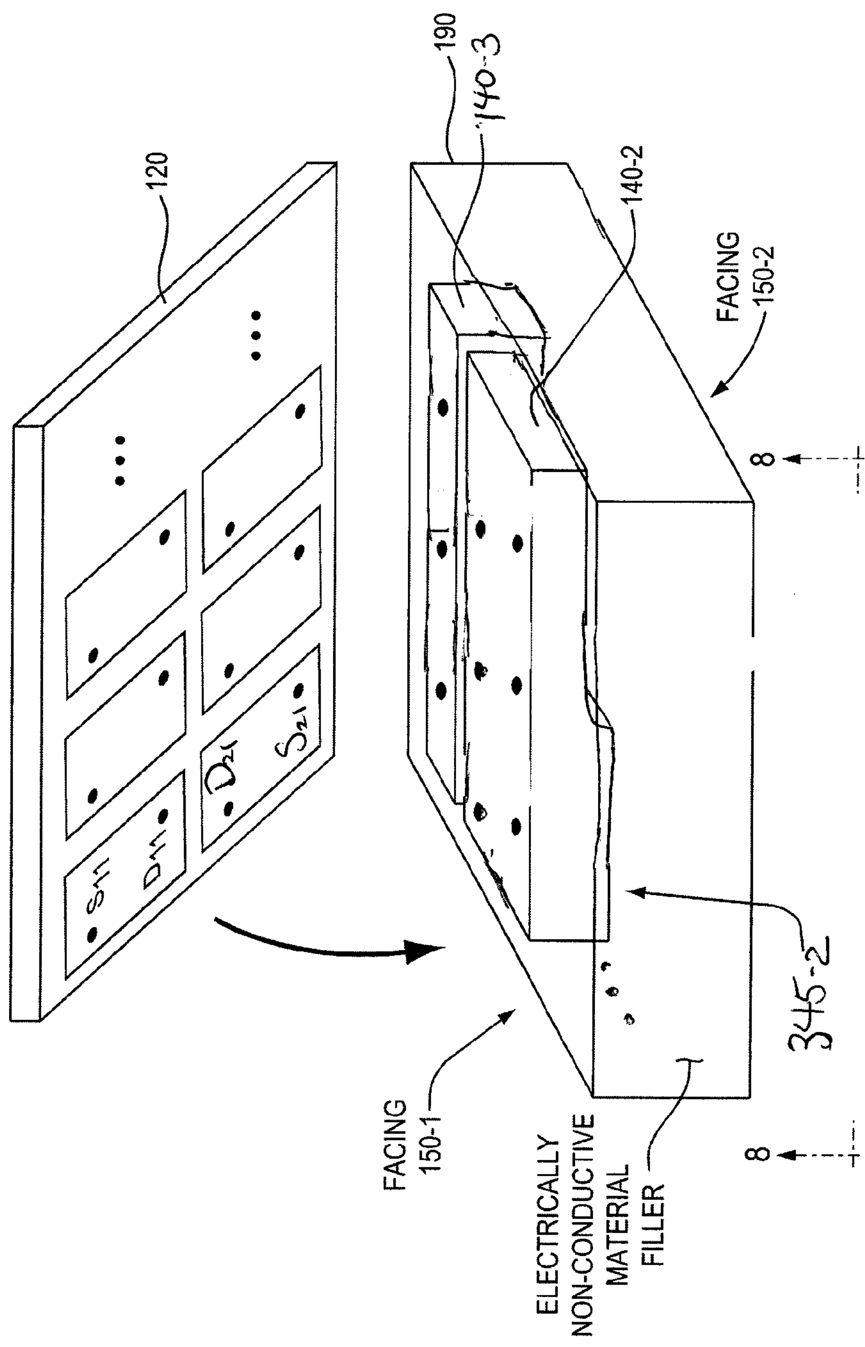
FIG. 3 is an example 3-D diagram illustrating coupling of an electrical circuit to conductive strips in a corresponding leadframe according to embodiments herein.

FIG. 3 is a 3-D diagram illustrating another example how an electrical circuit 120 is coupled to a leadframe device 190 according to embodiments herein. In this example figure, the conductive path 140-1 has been removed for easier viewing of conductive path 140-2 and corresponding contact element 345-2. In other words, conductive path 140-2 is not occluded by conductive path 140-1 as in the previous figure.

Figure 8:
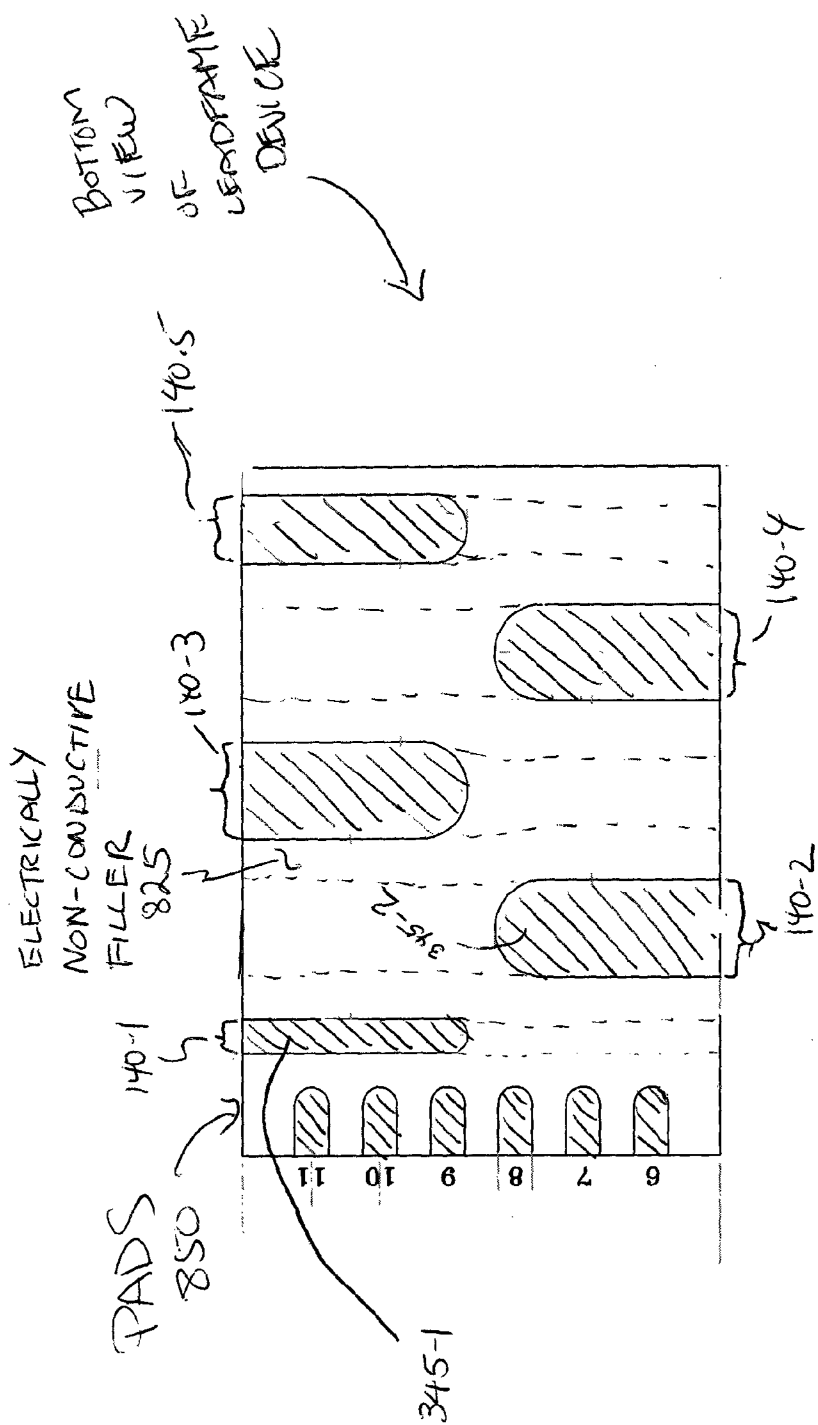
FIG. 8 is an example diagram illustrating pads on a leadframe package according to embodiments herein.

The contact element 345-1 (as in FIG. 2) and contact element 345-2 (in FIG. 3) can be offset with respect to each other so that respective pads under the leadframe device 190 are space apart from each other as shown in FIG. 8. More details of the offset and pad configuration of facing 150-2 are shown and discussed with respect to FIG. 8 below.

Figure 4A:
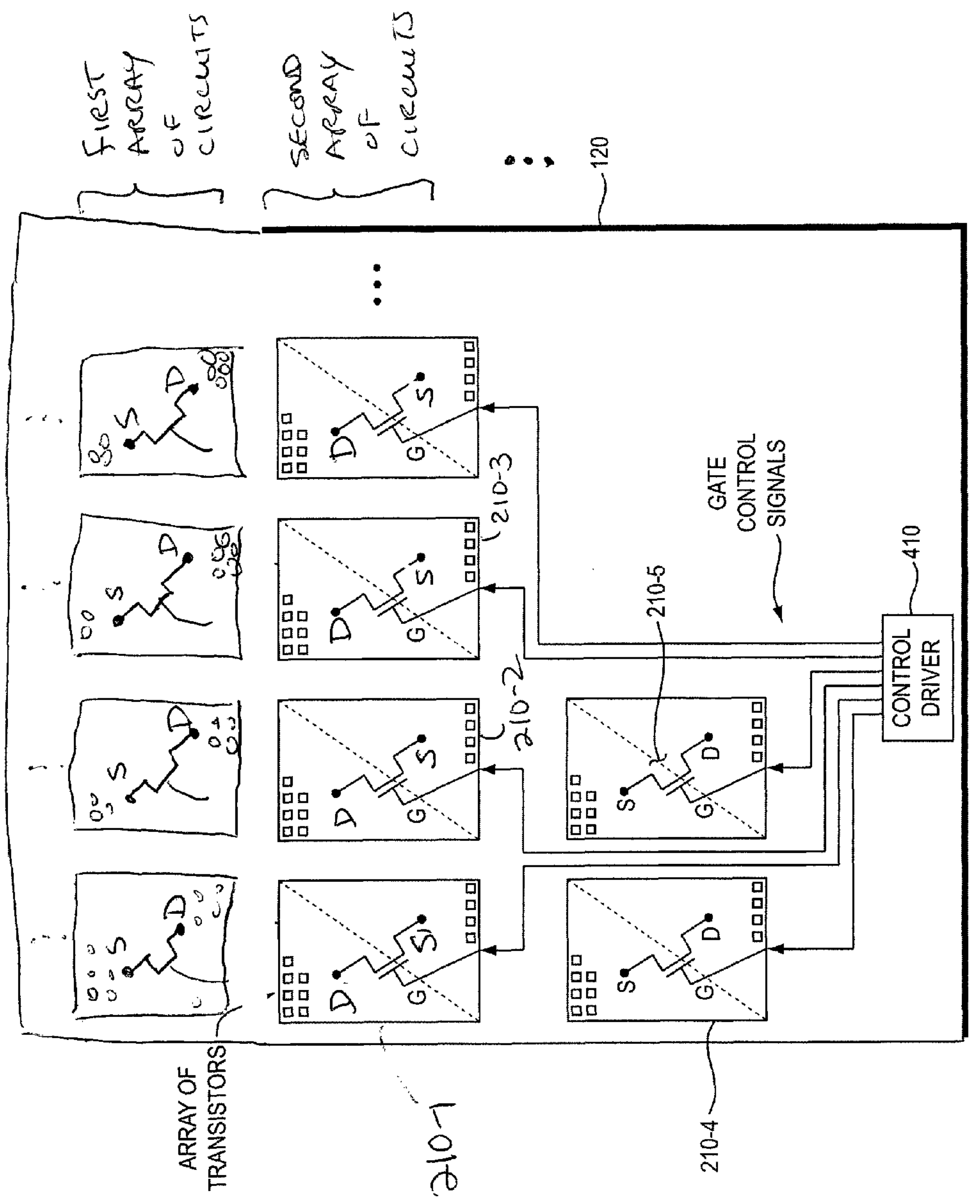
FIG. 4A is an example diagram of an electrical circuit including uniquely oriented tiles of transistors according to embodiments herein.

FIG. 4A is a diagram illustrating example functionality of the circuits 210 residing on electrical circuit 120 according to embodiments herein. As shown, each circuit 210-1 can provide functionality such as a switch device.

In one embodiment, each circuit 210 includes a respective array of field effect transistors in an integrated circuit that are connected in parallel to each other to form a switch circuit tile (e.g., circuit 210). As previously discussed, the switch circuit tiles each can comprise two electrical nodes (e.g., a source node and drain node) that connect to respective conductive paths 140 in the leadframe device 190. The common gates of circuit 210 are connected to and controlled by control driver 410.

Electrical circuit 120 can include a control driver 410. In one embodiment, as its name suggests, the control driver 410 produces a set of gate control signals that are used to drive the gates of each respective circuit 210.

In a further example embodiment, the gate control signals are formed in one or more metalization layer of a semiconductor device on which the respective switch tiles are formed. The electrical circuit 120 can include metalization to provide connectivity amongst the transistors within an array in the tile.

As shown in FIG. 4A and as previously discussed, the row of source nodes in a first array of circuits 210 can be disposed adjacent to or facing a row of source nodes in a second array of circuits 210 such that the source nodes in the first array and source nodes in the second array can be connected to a common conductive path in leadframe device 190. The row of drain nodes in the second array of circuits 210 can be disposed adjacent to or facing a row of drain nodes in a third array of circuits 210 such that the drain nodes in the second array and drain nodes in the third array can be connected to another common conductive path in leadframe device 190.

Figure 4B:
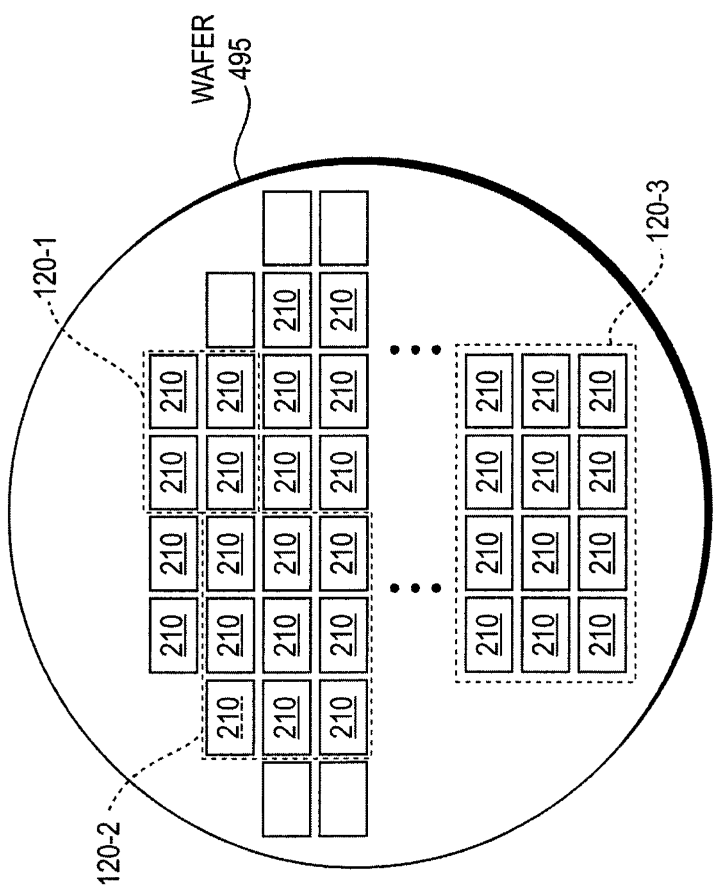
FIG. 4B is an example diagram of electrical circuits to be cut from a semiconductor wafer according to embodiments herein.

FIG. 4B is an example diagram illustrating an example (silicon-based) wafer 495 having circuits 210 according to embodiments herein. Note that inclusion of a control driver 410 is shown by way of non-limiting example only. The electrical circuit 120 may or may not include circuit 410 or other circuits.

Embodiments herein can include fabricating multiple circuits 210 on a respective wafer 495 such as that shown in FIG. 4B. The wafer 495 can be cut (e.g., sliced and diced) depending on how many of the switch circuits 210 are desired on a respective chip being packaged in the leadframe device 190. For example, the wafer 495 can be cut to produce an electrical circuit 120-1 that has four circuits 210 (e.g., four tiles of parallel transistors). The wafer 495 can be cut to produce an electrical circuit 120-2 that has nine circuits 210 (e.g., nine tiles of parallel transistors). The wafer 495 can be cut to produce an electrical circuit 120-3 that has twelve circuits 210 (e.g., twelve tiles of parallel transistors). As previously discussed, portions or all of the electrical nodes in each circuit can be independent of the nodes on the other circuits.

Of course, the leadframe device 190 can vary in size and shape as well to accommodate the different sized circuits 120. In other words, different numbers of transistors can be connected in parallel to create a tile circuit.

The transistors in a tile circuit also can be of different sizes. For applications requiring more robust switching functionality, the package also can be adjusted in size to accommodate larger or smaller electrical circuits 120. Conversely, for applications requiring less robust switching functionality, the package can be larger to accommodate larger electrical circuits 120.

As previously discussed, the leadframe device 190 is highly modular and scalable based on sizing and/or spacing of: conductive paths 140, circuits 210, circuit 120, source connections and drain connections on circuits 210, etc.

In one embodiment, sizing of a circuit includes adding/deleting rows and/or columns of a standard size of circuits 210 (e.g., a field effect transistor array) to produce a family of devices having different capabilities.

Figure 5:
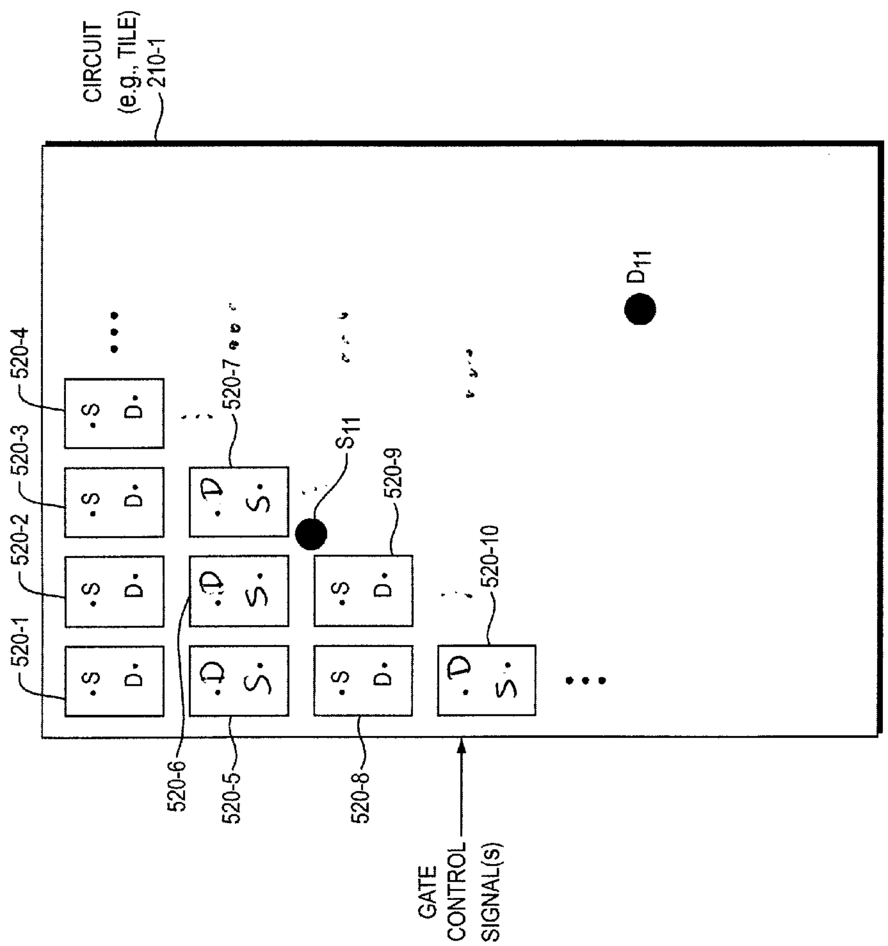
FIG. 5 is an example diagram of a tile including arrays of multiple transistors connected in parallel according to embodiments herein.

FIG. 5 is an example diagram illustrating an electrical circuit 210-1 according to embodiments herein. Note that each of multiple electrical circuits 210 or tiles of circuit 120 can be configured in a similar manner as circuit 210-1.

As shown, the example electrical circuit 210-1 can include arrays (e.g., rows and columns) of transistors 520 such as multiple field effect transistors in a semiconductor chip. The arrays of transistors 520 can include transistor 520-1, transistor 520-2, transistor 520-3, transistor 520-4, transistor 520-5, transistor 520-6, transistor 520-7, transistor 520-8, transistor 520-9, transistor 520-10, etc.

In one embodiment, an orientation of transistors in the integrated circuit are alternated as shown such that drains in pairs of adjacent rows are close in proximity to each other; sources of transistors are close to each other.

As mentioned above, the electrical circuit 210 can be one of multiple circuits on a respective single integrated circuit substrate. Via metalization in the integrated circuit, the gate nodes, source nodes, and drain nodes of the transistors 520 can be connected to each other in parallel.

More specifically, based on connectivity such as metalization in an integrated circuit, the source node of transistor 520-1 can be connected to each of the source nodes of transistor 520-2, 520-3, 520-4, etc.; the source node of transistor 520-2 can be connected to each of the source nodes of transistor 520-1, 520-3, 520-4, etc.; the source node of transistor 520-3 can be connected to each of the source nodes of transistor 520-1, 520-2, 520-4, etc.; and so on.

Via connectivity such as metalization in an integrated circuit, the drain node of transistor 520-1 can be connected to each of the drain nodes of transistor 520-2, transistor 520-3, transistor 520-4, etc.; the drain node of transistor 520-2 can be connected to each of the drain nodes of transistor 520-1, transistor 520-3, transistor 520-4, etc.; the drain node of transistor 520-3 can be connected to each of the drain nodes of transistor 520-1, 520-2, 520-4, etc.; and so on. Thus, in one embodiment, the array of transistors 520 can be interconnected to form a single functional transistor circuit having a common source node (e.g., node $S_{11}$) and common drain node (e.g., node $D_{11}$). In such an embodiment, the source node of each transistor 520 can be connected to common source node $S_{11}$, the drain node of each transistor 520 can be connected to common drain node $D_{11}$. The common source node $S_{11}$ and the common drain node $D_{11}$ couple to the conductive paths 140 in leadframe device 190.

Note that the gate node of each transistor 520 of circuit 210-1 can be electrically coupled to a common point and be controlled by a common gate control signal. As mentioned, the gates can be connected with each other via and interconnect such as metalization in an integrated circuit.

Figure 6:
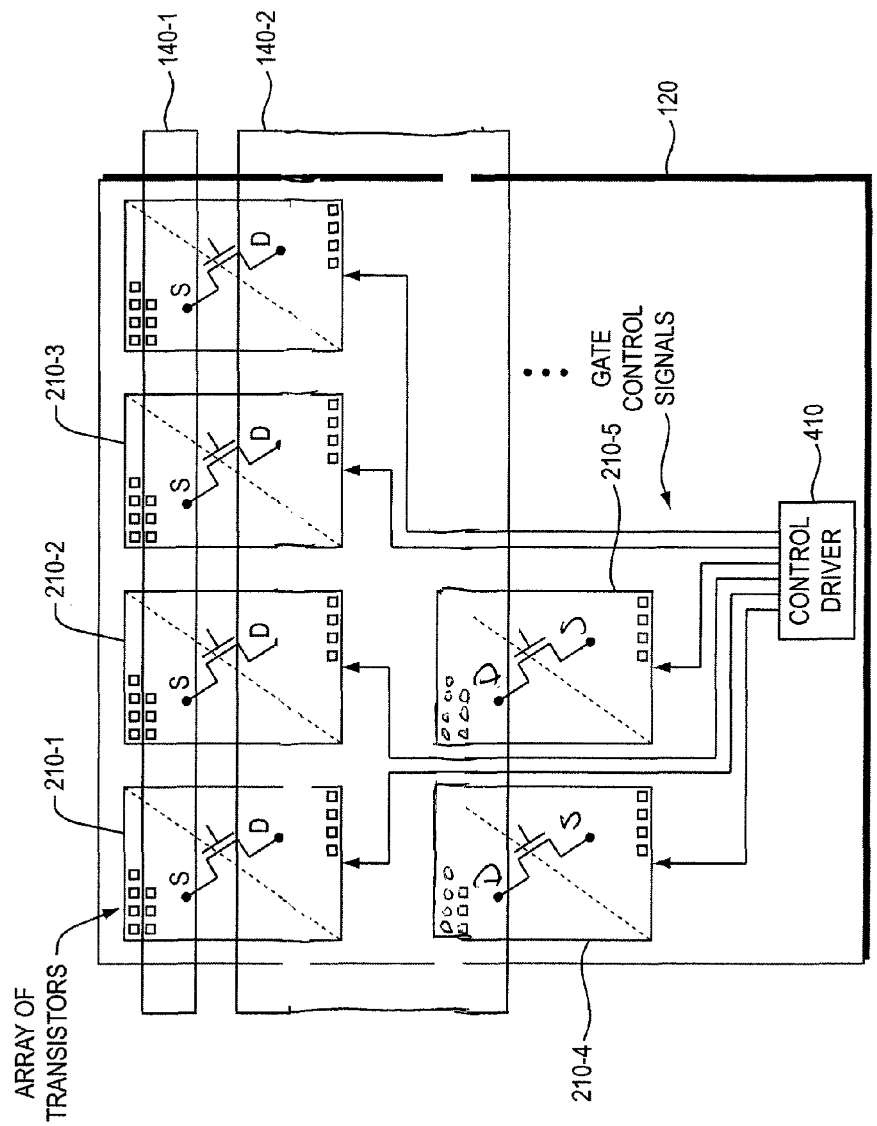
FIG. 6 is an example diagram illustrating connectivity between each of multiple transistor tile circuits and a respective conductive path or conductive strip in a leadframe device according to embodiments herein.

FIG. 6 is an example diagram illustrating interconnectivity of tiles (e.g., circuits 210) in parallel via conductive paths 140 in the leadframe device 190 according to embodiments herein.

As shown, in a manner as previously discussed, circuit 210-1 effectively becomes a single, large transistor having its common source node connected to conductive path 140-1 and common drain node connected to conductive path 140-2; circuit 210-2 is effectively a large transistor having its common source node connected to conductive path 140-1 and common drain node connected to conductive path 140-2; circuit 210-4 is effectively a single, large transistor having its common drain node connected to conductive path 140-2; and so on. Connecting the circuits 210 has an effect of creating yet a larger transistor device.

As previously discussed, the metal layer of electrical circuit 120 can include gate control signals from control driver 410 to each of the circuits 210. Creating paths for the gate control signals can be substantially easier according to embodiments herein because the conductive paths 140 in the leadframe device 190 provide a level of connectivity amongst the circuits 210 in lieu of metalization in an integrated circuit. Thus, control signals such as gate control signals or other control signals can be laid out between tiles (e.g., circuits 210) and thus not interfere with the interconnectivity layer disposed over the array of transistors in each circuit 210.

As shown, the spacing and/or widths of conductive paths can be selected depending on a spacing of the respective sources and drains of each circuit 210. For example, the spacing between conductive path 140-1 and conductive path 140-2 depends on locations of common source and drain node connections on respective circuits 210-1, 210-2, 210-3, etc. Thus, if each circuit 210 is designed to include a larger sized array (e.g., more rows and/or columns of transistors) or circuits 210, the spacing of the conductive paths 140-1 and conductive path 140-2 can be increased to account for a respective larger spacing between respective sources and drains of circuits 210. Conversely, if the size and/or number of transistors in the circuits 210 is reduced, the respective source connections and drain connections of circuits 210 will be closer together. In this latter case, a spacing and/or widths of conductive paths 140-1 and 140-2 also can be adjusted or reduced to account for the change in size of the circuits 210.

A spacing of the conductive paths 140 can be selected. In such a case, the size of circuits 210 and/or spacing of the sources and drain connections on each circuit 210 can be adjusted to ensure that the source and drain connections of each circuit 210 lines up with a respective conductive path 140 of leadframe device 190. Accordingly, embodiments herein include a highly scalable leadframe device 190.

As discussed herein, FIG. 6 illustrates that the conductive paths 140 provide connectivity between the circuits 210 in lieu of having to provide connectivity in one or more metalization layers of a semiconductor device. Use of the conductive paths 140 in a leadframe device 190 provides unique current path interconnects between circuits 210 (e.g., transistor array modules) to reserve a thick top layer metal in the circuit 120 such as a semiconductor device for routing of gate control signals and/or other control signals between control driver 410 and circuits 210. Accordingly, when circuit 120 is a semiconductor device having multiple tiles or arrays of interconnected transistors, the conductive paths 140 provide a low impedance gate interconnect between tiles while a thick top metal layer of the semiconductor device can be used to provide connectivity between a centralized driver circuit and the multiple tiles. This simplifies a leadframe design and further enhances scalability.

Figure 7:
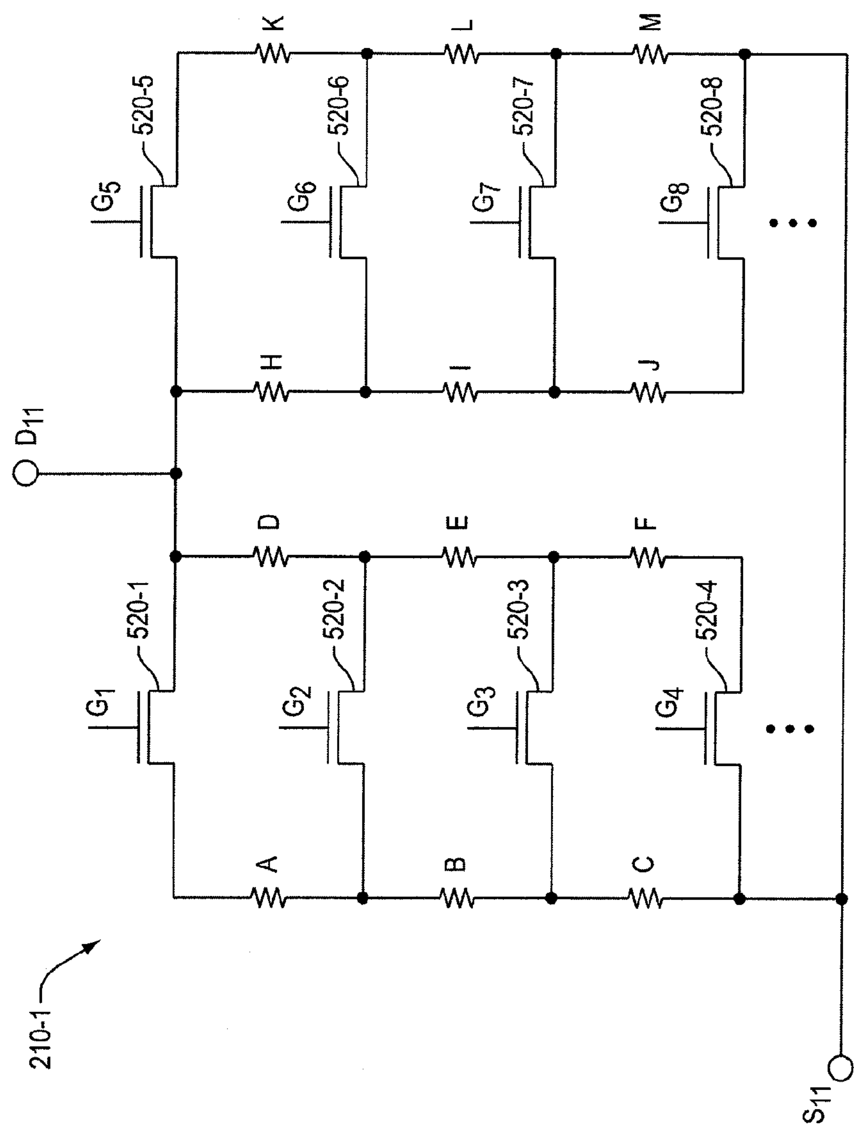
FIG. 7 is an example diagram illustrating a model of an array of interconnected transistors according to embodiments herein.

FIG. 7 is an example diagram illustrating interconnectivity of transistors 520 and hypothetical impedances according to embodiments herein. As previously discussed, the transistors 520 can be interconnected via metalization layers in an integrated circuit. By way of a non-limiting example, the embodiment of FIG. 7 illustrates how the multiple transistors 520 of a tile can be interconnected in such a way that the impedance paths for each transistor 520 are reasonably matched with each of the other transistors 520 in electrical circuit 210-1.

The impedance values A, B, C, D, E, F, G, H, I, J, K, L, M, etc. represent the impedances of conductive links (e.g., in metalization layers in an integrated circuit) between each of the transistors 520. The connectivity within the electrical circuit (and each of the other electrical circuits 210) can be configured such that the total impedance path for any transistor is within a tolerance value such as within, for example, 20%. In other words, the legs of the paths can be within a nominal value +/−10 percent such that each transistor in a tile has approximately the same operating characteristics.

Assume in the present example model of circuit 210 that the impedance values A, B, C, D, E, F, G, H, I, J, K, L, M, etc. represent an impedance of approximately 12.5 milliohms each. Note that the value of 12.5 milliohms is shown by way of non-limiting example only. The value may be different depending on the application.

The impedance associated with transistor 520-2 between node $D_{11}$ and node $S_{11}$ includes a sum of impedance D (approximately 12.5 milliohms), impedance B (approximately 12.5 milliohms), and impedance C (approximately 12.5 milliohms). Assume in this example that the impedance between node $D_{11}$ and transistor 520-1 is negligible. Thus, the total impedance path for transistor 520-2 (not including the transistor itself) is approximately 45 milliohms.

In furtherance of this example, the impedance associated with transistor 520-2 between node $D_{11}$ and node $S_{11}$ includes a sum of impedance D (approximately 12.5 milliohms), impedance B (approximately 12.5 milliohms), and impedance C (approximately 12.5 milliohms). Thus, the total impedance path for transistor 520-2 (not including the transistor itself) is approximately 45 milliohms.

The impedance associated with transistor 520-3 between node $D_{11}$ and node $S_{11}$ includes a sum of impedance D (approximately 12.5 milliohms), impedance E (approximately 12.5 milliohms), and impedance C (approximately 12.5 milliohms). Thus, the total impedance path for transistor 520-3 (not including the transistor itself) is approximately 45 milliohms.

The impedance associated with transistor 520-4 between node $D_{11}$ and node $S_{11}$ includes a sum of impedance D (approximately 12.5 milliohms), impedance E (approximately 12.5 milliohms), and impedance F (approximately 12.5 milliohms). Assuming that the impedance between node $S_{11}$ and transistor 520-4 is negligible, the total impedance path for transistor 520-4 (not including the transistor itself) is approximately 45 milliohms.

In a similar manner, the impedance path values for each of transistors 520-5, 520-6, 520-7, 520-8, etc. are each approximately equal to 45 milliohms as well.

Providing balanced path impedance interconnectivity in this manner is useful because the burden of providing isolation/coupling is more equally shared amongst the transistors 520. Thus, based on balancing in the interconnect layer, no single one of group of transistors in a circuit 210 is unduly stressed under high current sinking or sourcing conditions.

FIG. 8 is an example diagram illustrating a view of facing 150-2 (e.g., footprint and corresponding surface pads) of leadframe device 190 for connecting the leadframe device 190 to a circuit board substrate according to embodiments herein.

According to this example embodiment, only portions of the conductive paths 140 are exposed on a respective surface of the leadframe device 190. For example, contact element 345-1 (rather than a whole length of the conductive path 140-1) is exposed on a bottom surface of the leadframe device 190 for attaching to a host such as printed circuit board; contact element 345-2 (rather than a whole length of the conductive path 140-2) is exposed on a bottom surface of the leadframe device 190 for attaching to a host such as printed circuit board; and so on. Forming the contact elements 345 to be less than the full length of the respective conductive path reduces a likelihood that the circuit elements 345 will be accidentally shorted to each other as there is substantial spacing between contact element 345-2 and contact element 345-2.

Forming a circuit package to have fewer pads or pins as discussed herein (based on orientation of the source s and drains to be near each other) renders it easier to mount the circuit package to a respective circuit board substrate.

Note that additional pads 850 and corresponding conductive paths of the leadframe device 190 can provide connectivity with respect to the additional circuitry of the electrical circuit 120. For example, the pads 850 of leadframe device 190 can provide conductive pathways from a printed circuit board on which the leadframe device 190 resides and gate driver or related circuitry of electrical circuit 120.

Figure 9:
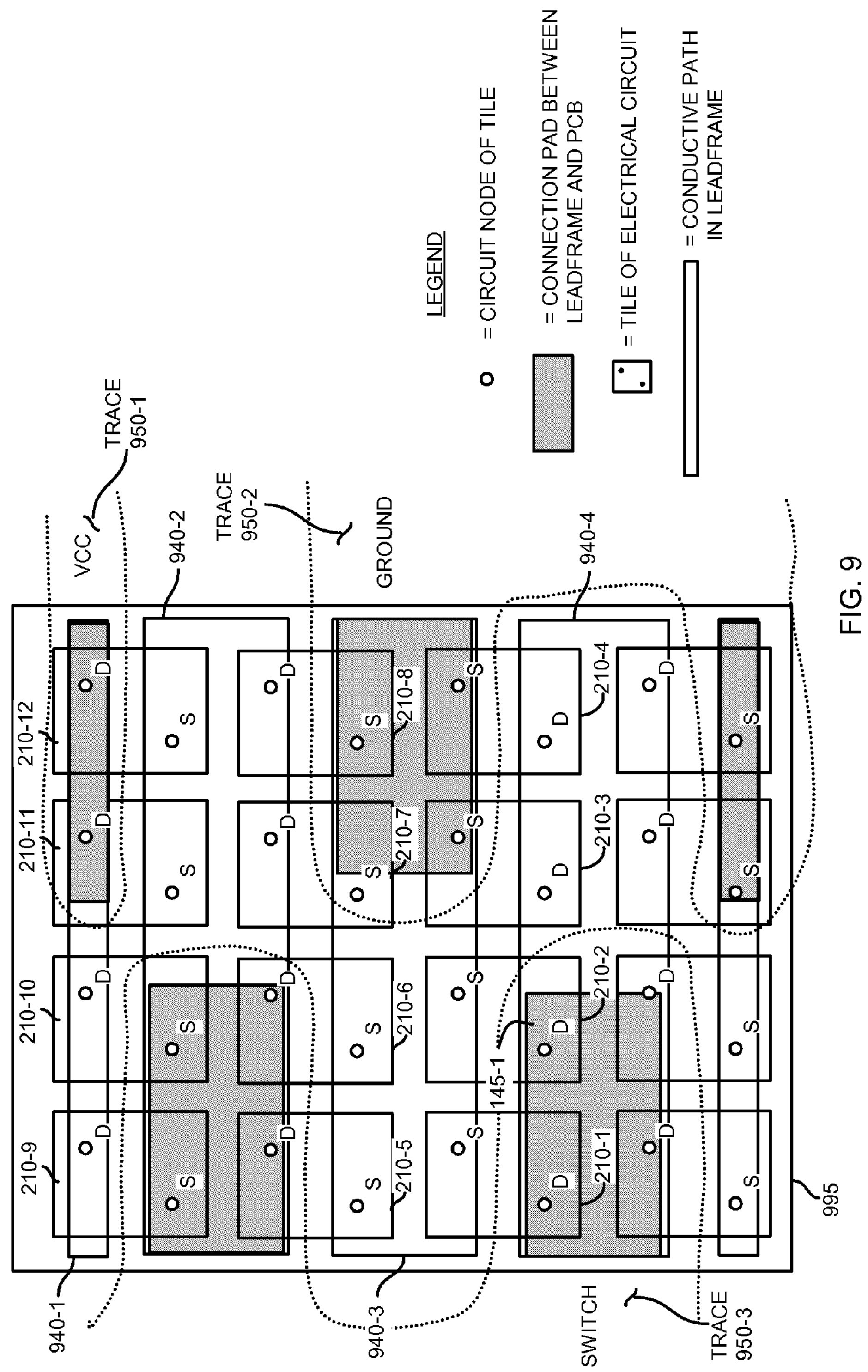
FIG. 9 is a see-through diagram illustrating connectivity of an electrical switching circuit, through a leadframe package, to a host substrate on which the leadframe is mounted according to embodiments herein.

FIG. 9 is an example transparent view diagram illustrating interconnectivity of electrical circuit 120 to corresponding traces of a circuit board via a leadframe device 190 according to embodiments herein.

As shown, traces 950 can be electrically isolated from each other so as not to short drains to sources, etc. Each of traces 950 can be a route, path, surface pad, conductive strip, etc., on a host such as a printed circuit board to which the circuit 120 is mounted.

As previously discussed, each of circuits 210 in circuit 120 can be configured by interconnecting an array of field effect transistors in parallel to produce a respective field effect transistor switch circuit. Thus, as previously discussed, circuit 210-1 can be a first field effect transistor switch circuit tile, circuit 210-2 can be a second field effect transistor switch circuit tile, circuit 210-3 can be a third field effect transistor switch circuit, circuit 210-4 can be a fourth field effect transistor switch circuit tile, circuit 210-5 can be a fifth field effect transistor switch circuit tile, circuit 210-6 can be a sixth field effect transistor switch circuit tile, circuit 210-7 can be a seventh field effect transistor switch circuit, circuit 210-8 can be an eighth field effect transistor switch circuit tile, and so on.

As shown, and as previously discussed, the circuits 210 of electrical circuit 120 reside at a topmost level (e.g., connection interface 110-1) of the transparent view. At connection interface 110-1 (see also FIG. 1), each circuit 210 connects to a corresponding conductive path 140 beneath it.

For example, source node of circuit 210-1 connects to conductive path 940-3; source node of circuit 210-2 connects to conductive path 940-3; source node of circuit 210-3 connects to conductive path 940-3; and so on. Drain node of circuit 210-1 connects to conductive path 940-4; drain node of circuit 210-2 connects to conductive path 940-4; drain node of circuit 210-3 connects to conductive path 940-4; and so on. As previously discussed, the source nodes and drain nodes of each respective circuit can be electrically isolated from each other except for respective electrical connections provided by the conductive paths 140.

As shown, source node of circuit 210-5 connects to conductive path 940-3; source node of circuit 210-6 connects to conductive path 940-3; source node of circuit 210-7 connects to conductive path 940-3; and so on. Drain node of circuit 210-5 connects to conductive path 940-2; drain node of circuit 210-6 connects to conductive path 940-2; drain node of circuit 210-7 connects to conductive path 940-2; and so on.

As shown, source node of circuit 210-9 connects to conductive path 940-2; source node of circuit 210-10 connects to conductive path 940-2; source node of circuit 210-11 connects to conductive path 940-2; source node of circuit 210-12 connects to conductive path 940-2; and so on. Drain node of circuit 210-9 connects to conductive path 940-1; drain node of circuit 210-10 connects to conductive path 940-1; drain node of circuit 210-11 connects to conductive path 940-1; drain node of circuit 210-12 connects to conductive path 940-1; and so on.

Figure 10:
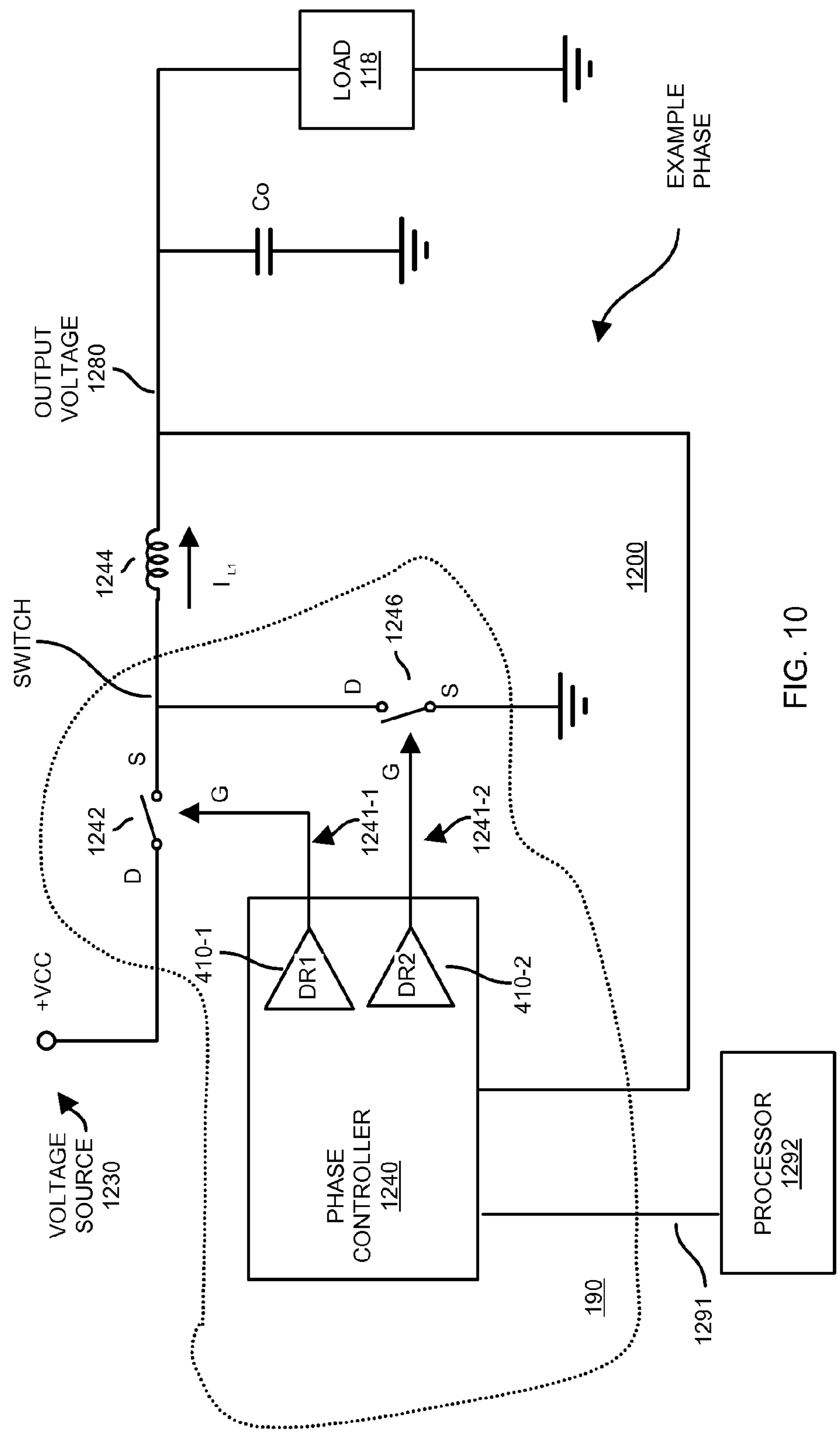
FIG. 10 is a diagram illustrating switching functionality provided by an example leadframe device and related components according to one embodiment herein.

In contrast to the embodiments as discussed above, coupling of both source nodes and drain nodes to conductive path 940-2 creates a series connection of the high side switch 1242 and the low side switch 1246 as in FIG. 10. High side switch 1242 as implemented in the circuit package of FIG. 9 includes a parallel combination of circuits 210-9, 210-10, 210-11, and 210-12. Low side switch 1246 as implemented in the circuit package of FIG. 9 includes a parallel combination of circuits 210-1, 210-2, 210-3, 210-4, 210-5, 210-6, 210-7, 210-8, and so on. Trace 950-1 connects to Vcc, trace 950-2 connects to ground, trace 950-3 connects to switch node of inductor 1244.

Referring again to FIG. 9, connection interface 110-2 provides connectivity between the contact elements (cross-hatched regions of respective conductive paths 140) of leadframe device 190 and the circuit board or substrate on which traces 950 reside. For example, the cross-hatched section (e.g., pad or pin) of conductive path 940-1 connects the conductive path 940-1 to trace 950-1 of the circuit board; the cross-hatched section (e.g., pad or pin) of conductive path 940-2 connects the conductive path 940-2 to trace 950-3 of the circuit board; the cross-hatched section (e.g., pad or pin) of conductive path 940-3 connects the conductive path 940-3 to trace 950-2 of the circuit board; the cross-hatched section (e.g., pad or pin) of conductive path 940-4 connects the conductive path 940-4 to trace 950-3 of the circuit board; and so on.

Accordingly, via conductive paths 940, the source nodes and drain nodes get connected to respective traces 950.

As mentioned, each of the conductive paths 940-2 and 940-4 can be electrically isolated from each other until after the leadframe device 190 is connected to a host substrate. After forming a physical connection between the leadframe device 190 and host as discussed above, the conductive paths 940-2 and 940-4 become electrically connected via trace 950-1.

Via application of a gate signal to appropriate circuits 210, the switch circuits 210 provide a low impedance path or high impedance path between trace 950-1 and trace 950-3 or between trace 950-2 and trace 950-3. More specifically, an OFF gate signal applied to circuits in the high side switch 1242 (e.g., a combination of circuits 210-9, 210-10, 210-11, and 210-12) causes the circuits 210 to provide a high impedance path between Vcc and the switch node. An ON gate signal applied to circuits in the high side switch 1242 causes the combination of circuits to provide a low impedance path.

An OFF gate signal applied to circuits in the low side switch 1246 (e.g., a combination of circuits 210-1, 210-2, 210-3, . . . , and 210-8, . . . ) as shown causes the circuits 210 in the low side switch 1246 to provide a high impedance path between the switch node and ground. An ON gate signal applied to circuits in the low side switch 1246 causes the circuits in the low side switch 1246 to provide a low impedance path between the switch node and ground.

Control signals for driving switch can be generated internally with respect to the electrical circuit 120 or received off-chip via signals on the host substrate that are passed up to the electrical circuit 120 via conductive paths in the leadframe device 190. In one embodiment, a driver circuit 410 disposed on electrical circuit 120, when so configured, generates the switch control signals based on receipt of an input signal. The input signal can be received by the driver circuit 410 from the circuit board substrate via one or more conductive path in the leadframe device 190 between the host substrate and the driver circuit.

Thus, embodiments herein further include a packaged circuit device comprising: a conductive strip 940-2 and a semiconductor chip substrate 995 including a first array of switch circuits (e.g., switch circuit 210-9, switch circuit 210-10, switch circuit 210-11, switch circuit 210-12, . . . ) disposed substantially adjacent and substantially parallel to a second array of switch circuits (e.g., switch circuit 210-5, switch circuit 210-6, switch circuit 210-7, switch circuit 210-8, . . . ). A first connectivity interface of the conductive strip 940-2 couples switch circuits 210 in the first array and switch circuits 210 in the second array to the conductive strip 940-2. A second connectivity interface of the conductive strip 940-2 can be configured to electrically couple the conductive strip 940-2 in the packaged circuit to one or more electrical nodes of a host circuit substrate to which the packaged circuit device can be attached or mounted.

Any suitable method can be used to couple the nodes of circuits 210 to the conductive strips. By way of a non-limiting example, one way to couple nodes such as source nodes and drain nodes of the circuits 210 to the conductive strips is solder.

As previously discussed, each switch circuit 210 in the first array of switch circuits 210-9, 210-10, 210-11, and 210-12 can include a respective set of transistors connected in parallel with each other via connectivity provided in the semiconductor chip substrate. Each switch circuit in the second array of switch circuits 210-5, 210-6, 210-7, 210-8 can include a respective set of transistors connected in parallel with each other via connectivity provided in the semiconductor chip substrate. Each switch circuit in the third array of switch circuits 210-1, 210-2, 210-3, 210-4 can include a respective set of transistors connected in parallel with each other via connectivity provided in the semiconductor chip substrate.

Switch circuits in the first array and switch circuits in the second array can be electrically isolated from each other except for the circuit connectivity provided by the conductive strip 940-2 between the nodes of the first array of switch circuits and nodes of the second array of switch circuits.

In one embodiment, each switch circuit in the first array of switch circuits includes a source node and a drain node; each switch circuit in the second array of switch circuits includes a source node and a drain node. The connectivity interface provides electrical coupling of source nodes in the first array of switch circuits to drain nodes in the second array of switch circuits.

In further embodiments, the source nodes of switch circuits in the first array form a first array of circuit nodes; the drain nodes in the second array form a second array of circuit nodes. As shown, the first array of circuit nodes can be disposed substantially parallel to the second array of circuit nodes.

In addition to the first array and second array of switch circuits as discussed above, circuit substrate (such as a semiconductor chip substrate) can include a third array of switch circuits (e.g., switch circuit 210-1, 210-2, 210-3, 210-4, . . . ) disposed substantially adjacent and substantially parallel to the first and second array of switch circuits. Another connectivity interface in the packaged circuit device couples switch circuits 210 in the third array and switch circuits in the second array to the conductive strip 940-3. For example, in one embodiment, the conductive strip 940-3 electrically couples source nodes in the second array of switch circuits to source nodes in the third array of switch circuits 210-1, 210-2, 210-3, and 210-4. Embodiments herein can include packaging equipment or manufacturing equipment to manufacture leadframe devices. Such equipment can be configured to: receive a semiconductor chip substrate 995 including a first array of switch circuits 210 disposed substantially adjacent and substantially parallel to a second array of switch circuits; and receive a leadframe package 190 including a conductive strip 940-2. The conductive strip 940-2 can include a connectivity interface to electrically couple the conductive strip 940-2 in the leadframe package 190 to an electrical node of a host circuit substrate 170. The packaging equipment can provide or create a connectivity interface coupling switch circuits 210 in the first array and switch circuits in the second array to the conductive strip 940-2 of the leadframe package 190. Thus, circuit substrate can be attached and/or coupled to one or more conductive strips in the leadframe package 190.

In one embodiment, the switch circuits in the first array and switch circuits in the second array are electrically isolated from each other except for circuit connectivity (e.g., a highly conduit path) provided by the conductive strip between the first array of switch circuits and the second array of switch circuits. In other words, the one or more conductive strips in the leadframe package can connect the circuits 210 in parallel with each other. Additionally, a conductive strip can provide serial connectivity. For example, conductive strip 940-2 serially connects the first array of switch circuits 210 (e.g., high side switch) and second array of switch circuits 210 (e.g., low side switch) with each other.

In further embodiments, the manufacturing equipment providing the connectivity interface couples source nodes in the first array of switch circuits 210-9, 210-10, 210-11, and 210-12 to drain nodes in the second array of switch circuits 210-5, 210-6, 210-7, and 210-8 via the conductive strip 940-2. The first array of switch circuits (e.g., forming a high side switch 1242) and second array of switch circuits (e.g., forming a low side switch 1246) are serially connected with each other via the conductive strip 940-2.

Embodiments herein can further include manufacturing equipment configured to electrically coupling switch circuits in the third array (e.g., circuit 210-1, 210-2, 210-3, and 210-4) and switch circuits in the second array to conductive strip 940-3 of the leadframe package 190. The conductive strip 940-3 can be substantially adjacent and substantially parallel to conductive strip 940-2 as shown. In one embodiment, the leadframe packaging equipment electrically couples source nodes in the second array of switch circuits 210-5, 210-6, 210-7, 210-8 to source nodes in the third array of switch circuits via the conductive strip 940-3.

FIG. 10 is a diagram illustrating functionality associated with an example leadframe device 190 of a power supply system 1200 according to embodiments herein.

More specifically, a leadframe device 190 populated according to embodiments herein can be configured to include a phase controller 1240 (e.g., controller logic), a control driver 410 (e.g., control driver 410-1 and control driver 410-2), high side switch 1242, low side switch 1246, as well as any other conventional circuitry to control an output voltage applied to power load 118. As discussed above, a parallel connection of switch circuits 210-9, 210-10, 210-11, and 210-12 can form a high side switch 1242 of a switching power supply. Note that any number of switch circuits 210 can be connected in parallel to form a high side switch. A parallel connection of switch circuits 210-1, 210-2, 210-3, 210-4, 210-5, 210-6, 210-7, 210-8, etc. as shown can form a high side switch 1242. Note that any number of switch circuits 210 can be connected in parallel to form a low side switch of a switching power supply.

According to other embodiments, note that the phase controller resides in a circuit separate from the high side switch and low side switch. In such an embodiment, leadframe device 190 or circuit package as discussed herein can include merely the high side switch 1242 and low side switch 1246 as discussed with respect to FIG. 9 above.

Referring again to FIG. 10, phase controller 1240 monitors the output voltage 1280 and generates appropriate control signals for driving high side switch circuitry 1242 and low side switch circuitry 1246 in the leadframe device 190. The high side switch circuitry 1242 and low side switch circuitry 1246 of power supply system 1200 represent the functionality provided by connection of circuits 210 (on circuit 120) via conductive paths 140 to a host such as a printed circuit board as described herein.

As previously discussed, additional conductive paths in the leadframe device 190 can provide connectivity between circuit 120 and a respective printed circuit board. Accordingly, any portion or functionality of a power supply system 1200 can reside in leadframe device 190 rather than on the printed circuit board.

A benefit of such a configuration is space savings. Typically, conventional power supplies require layout of many components on a respective printed circuit board to create a power supply. This requires considerable printed circuit board real estate and cost to assemble. In contrast to conventional techniques, inclusion of control circuitry and/or related circuitry on leadframe device 190 as described herein can reduce an overall impact of populating a printed circuit board with a power supply control system because a printed circuit board can be populated with one or more leadframe devices rather than a multitude of individual components. Further enhancements over conventional techniques as discussed herein reduce a number of pads associated with the leadframe device 190.

Again, each of the high side switch circuitry 1242 and low side switch circuitry 1246 of leadframe device 190 can be configured in accordance with the techniques as discussed herein.

More specifically, in an example embodiment, a first set of conductive paths 140 in the leadframe device 190 can provide parallel connectivity amongst multiple circuits 210 of circuit 120 to produce high side switch circuitry 1242; a second set of conductive paths 140 in the leadframe device 190 can provide parallel connectivity amongst multiple circuits 210 in circuit 120 to produce low side switch circuitry 1246; and so on. As previously discussed, the leadframe device 190 includes contact elements 145 for connecting the switch circuitry to a printed circuit board.

Each phase in power supply system 1200 can require a respective independently operating high side switch and low side switch. The leadframe device 190 can be configured to provide switching circuitry for each of a number of phases. Thus, in certain embodiments, the leadframe device 190 can include a multi-phase power supply controller and related circuitry.

In addition to including control driver 410 as discussed above in FIG. 4A, note that circuit 120 can include phase controller 1240 for monitoring output voltage 1280 and producing phase control signals to control respective high side switch circuitry 1242 and low side switch circuitry 1246 for the embodiment as discussed in FIG. 10. Accordingly, the leadframe device 190 can include any suitable circuits to facilitate generation of output voltage 180.

Additionally, note that the leadframe device 190 can be configured to include a conductive path from circuit 120 to communication link 1291 on a printed circuit board such that the phase controller 1240 and processor 1292 (also on circuit board) can communicate with each other. In one embodiment, the output voltage 180 can be used to power the processor 1292.

As shown in the example embodiment of FIG. 10, during operation, phase controller 1240 generates control signal 1241-1 to control respective high side switch circuitry 1242 and control signal 1241-2 to control low side switch circuitry 1246. When high side switch circuitry 1242 is turned ON via controller 1240 (while low side switch circuitry 1246 is OFF), the current through inductor 1244 increases via a conductive path provided by high side switch circuitry 1242 between voltage source 1230 and inductor 1244. When low side switch circuitry 1246 is turned ON via controller 1240 (while high side switch circuitry 1242 is OFF), the current through inductor 1244 decreases based on a conductive path through the low side switch circuitry 1246 between the inductor 1244 and ground.

As mentioned above, based on switching of the high side switch circuitry 1242 and the low side switch circuitry 1246, the leadframe device 190 (e.g., a power supply control system) can regulate the output voltage 1280 within a desired range for providing power to load 118.

In one embodiment, leadframe device 190 can include respective circuitry to control any number of phases present in leadframe device 190 of a power supply system 1200. Each phase can include high side switch circuitry and low side switch circuitry as previously discussed. To deactivate a respective phase, the phase controller 1240 can set both high side switch circuitry 1242 and low side switch circuitry 1246 of the phase to an OFF state.

Respective high and low side switches for each of multiple phases can be disposed in a single leadframe device 190. Alternatively, high and low side switches for a respective phase can be disposed in a single circuit package. In this latter embodiment, a circuit package is needed for each phase to perform switching operations.

Figure 11:
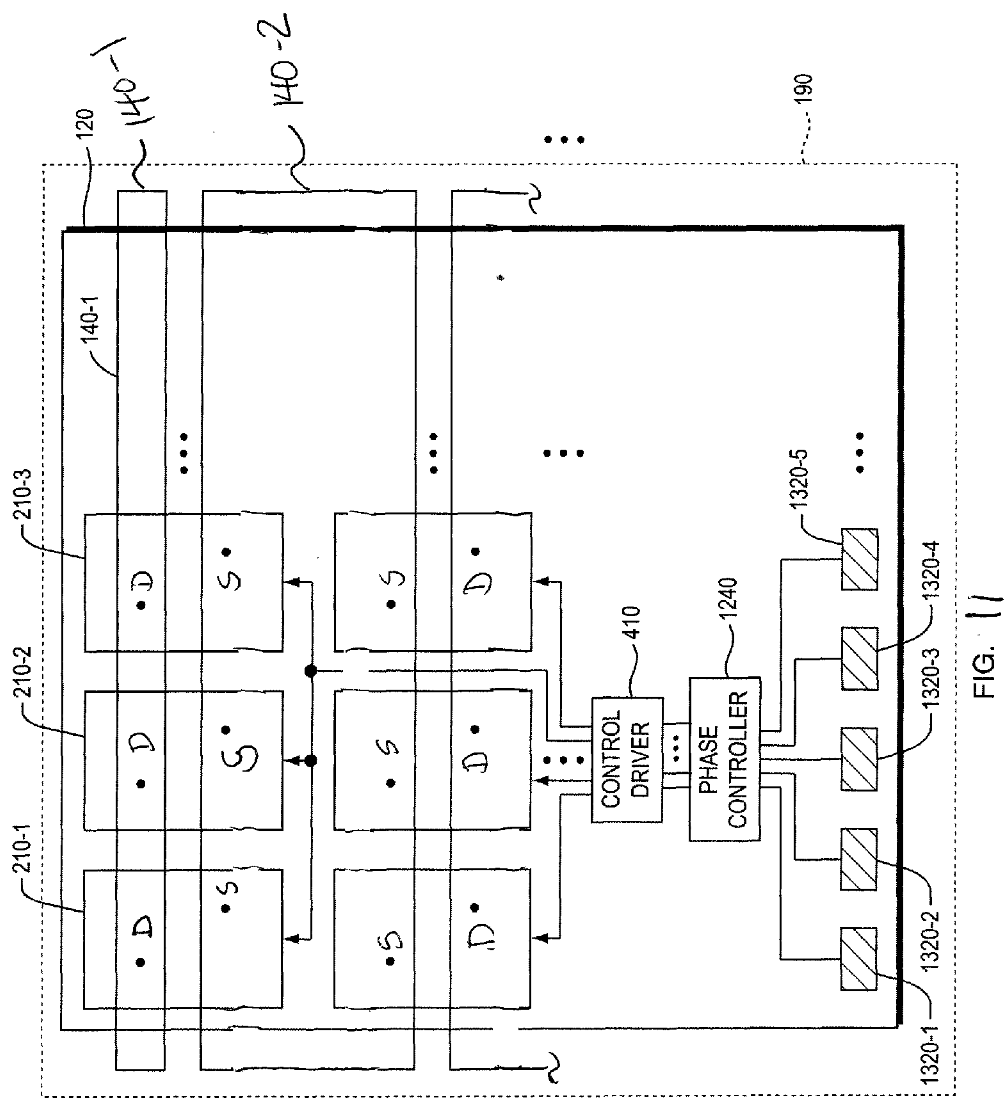
FIG. 11 is a diagram illustrating packaging of a circuit and related components in an example leadframe device according to embodiments herein.

FIG. 11 is a diagram illustrating an example leadframe device 190 according to embodiments herein. As shown, conductive paths 140 in leadframe device 190 provide connectivity amongst a number of transistor arrays (e.g., multiple rows of transistors connected in parallel as discussed above) to provide high and low side switching capability for each of one or more phases supported by the leadframe device 190.

As previously discussed, the leadframe device 190 according to embodiments herein can provide connectivity with traces on a host circuit board via conductive paths through the leadframe device 190.

In this example configuration of FIG. 11, conductive path 1320-1, conductive path 140-1, conductive path 140-2, conductive path 140-3, etc., provide connectivity from the circuits 210 through the leadframe device 190 to a respective circuit such as a host on which the leadframe device 190 resides. Accordingly, via such connectivity, any components previously mounted to a host circuit board can be located on the leadframe device 190 instead.

As mentioned above, different families of leadframe devices or sizes of leadframe devices can be manufactured using different numbers of circuits 210 (e.g., switch tiles 210). For example, a number of circuits included in a leadframe device 190 can vary by adding or removing rows and/or columns of tiles of an integrated circuit that is subsequently packaged in a leadframe device.

In accordance with a first specification, embodiments herein include: receiving a first integrated circuit, the first integrated circuit having a first set of electrically isolated switch circuit nodes disposed thereon; receiving a first leadframe device in which to package the first integrated circuit; and electrically coupling the first integrated circuit to a facing of the first leadframe device to provide connectivity between the first set of electrically isolated switch circuit nodes on the first integrated circuit via at least one conductive path in the first leadframe device. The electrically isolated switch circuit nodes can include a row of source nodes in a first array of transistors disposed adjacent to a row of source nodes in a second array of transistors as discussed herein.

In accordance with a second specification that is modified or different with respect to the first specification, embodiments herein include: receiving a second integrated circuit, the second integrated circuit having a second set of electrically isolated switch circuit nodes disposed thereon, the second integrated circuit having a different number of electrically isolated switch circuit nodes than the first integrated circuit; receiving a second leadframe device in which to package the second integrated circuit; and electrically coupling the second integrated circuit to a facing of the second leadframe device to provide connectivity between the second set of electrically isolated switch circuit nodes via at least one conductive path in the second leadframe device. The electrically isolated switch circuit nodes can include a row of source nodes in a first array of transistors disposed adjacent to a row of source nodes in a second array of transistors as discussed herein.

Thus, a number of switch tiles can be added or removed from one design to another to create circuit package devices having different switching capabilities.

Figure 12:
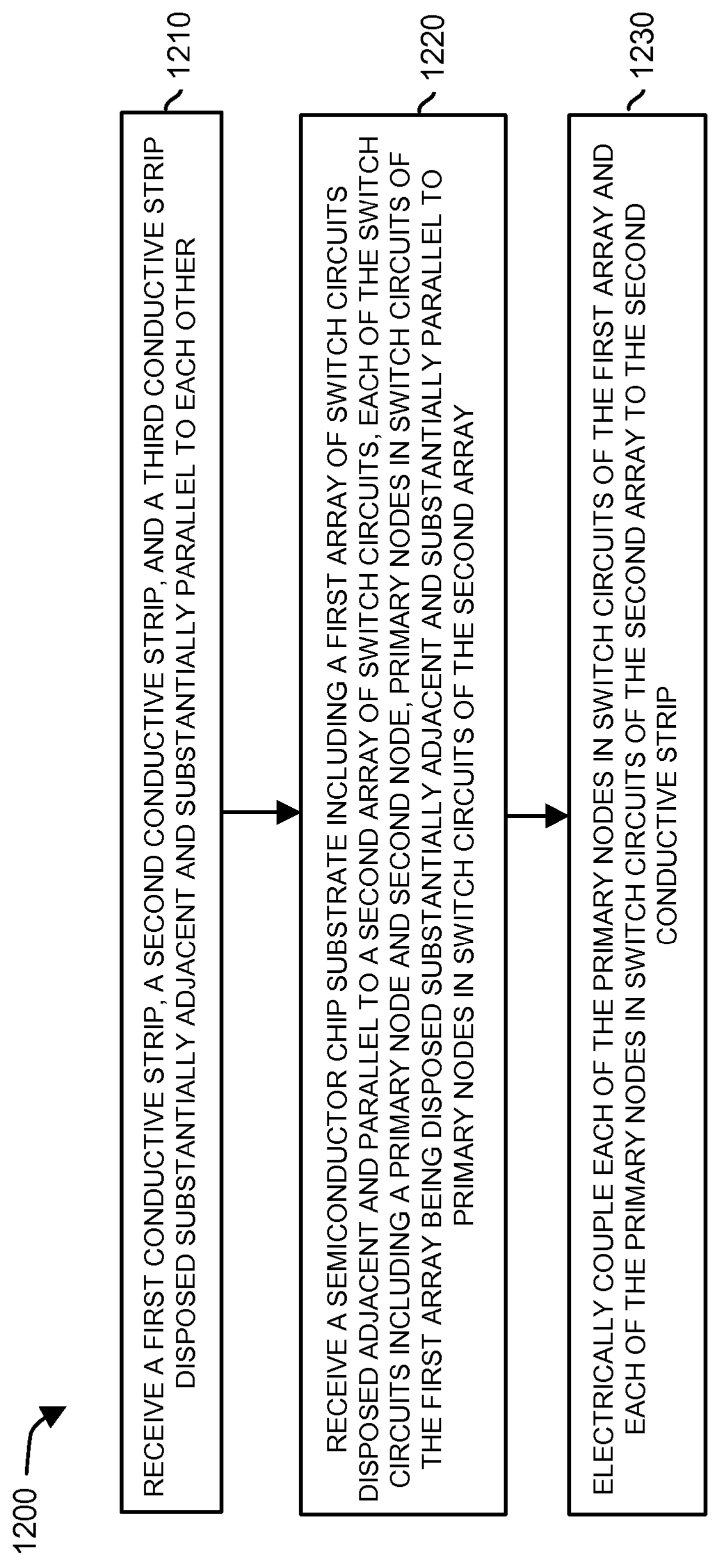
FIGS. 12-15 are flowcharts illustrating example methods supporting creation of a circuit package and integrated circuit according to embodiments herein.

FIG. 12 is a flowchart 1200 illustrating an example method of packaging an electrical circuit 120 in a leadframe device 190 according to embodiments herein. Note that there will be some overlap with respect to concepts as discussed above. In one embodiment, the steps in FIG. 12 are performed by one or more manufacturing facilities, machines, handlers, etc., that produce circuit packages.

Step 1210 includes receiving a leadframe component including a first conductive strip, a second conductive strip, and a third conductive strip disposed substantially adjacent and substantially parallel to each other. Each of the conductive strips can be a conductive path 140 in a leadframe device 190.

Step 1220 includes receiving a semiconductor chip substrate such as circuit 120 including a first array of switch circuits 210 or tiles disposed adjacent and parallel to a second array of switch circuits 210. Each of the switch circuits 210 can include a primary node (e.g., first type of node) such as a source node and secondary node (e.g., second type of node) such as a drain node. Primary nodes in switch circuits of the first array are disposed substantially adjacent (e.g., next to) and substantially parallel to primary nodes in switch circuits of the second array.

Step 1230 includes electrically coupling each of the primary nodes in switch circuits 210 of the first array and each of the primary nodes in switch circuits 210 of the second array to a single conductive strip such as the second conductive strip in the leadframe device 190. Accordingly, rows of primary nodes in adjacent arrays of transistors can be connected to a single conductive strip as opposed to two separate conductive strips in a circuit package as is done in conventional methods.

Figure 13:
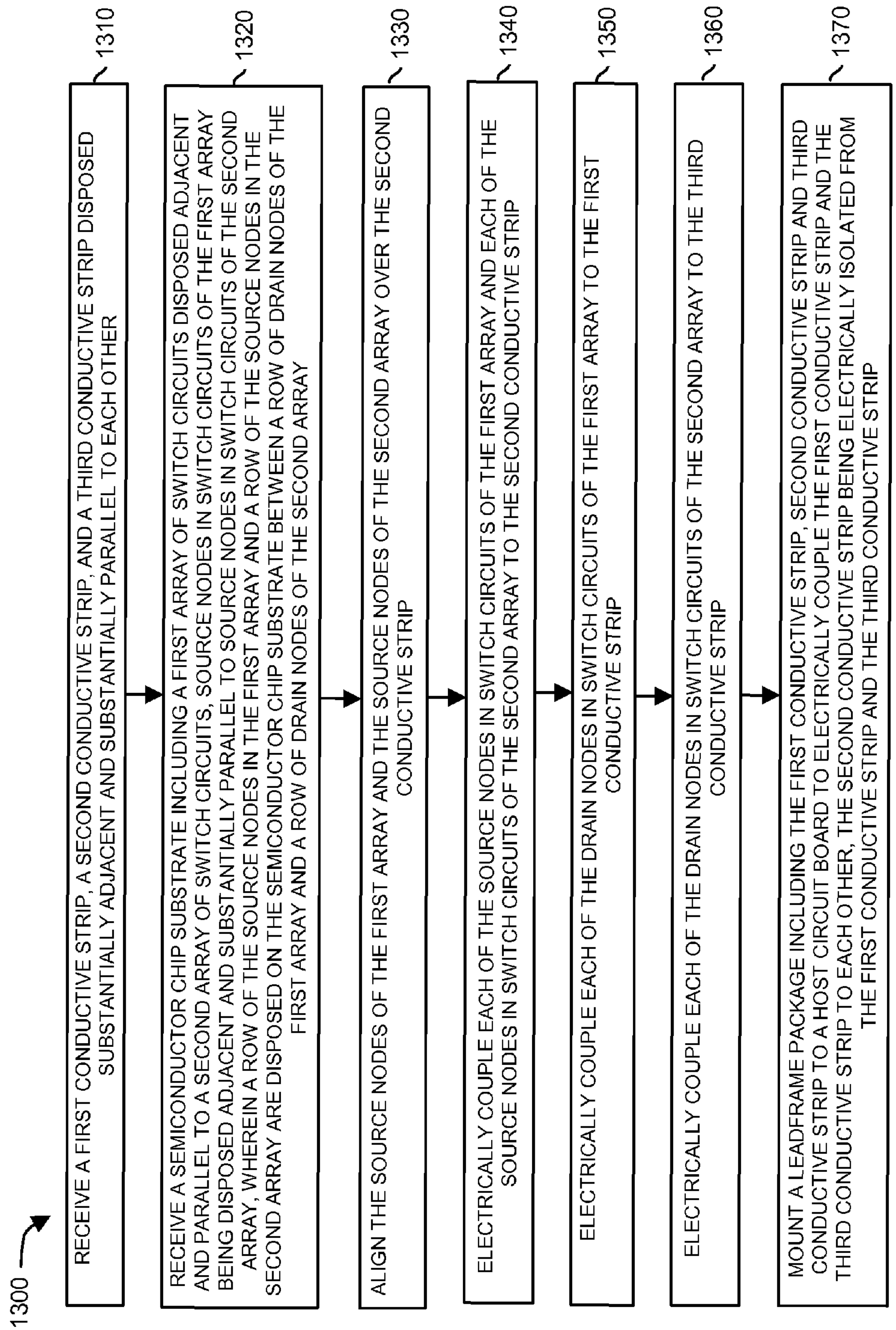

FIG. 13 is a flowchart 1300 illustrating a detailed example method of packaging an electrical circuit 120 in a leadframe device 190 according to embodiments herein. Note that there will be some overlap with respect to concepts as discussed above. In one embodiment, the steps in FIG. 13 are performed by one or more manufacturing facilities, machines, handlers, etc., that produce circuit packages.

Step 1310 includes receiving a leadframe component comprising a first conductive strip, a second conductive strip, and a third conductive strip disposed substantially adjacent and substantially parallel to each other. As mentioned, each of the conductive strips can be a conductive path 140 in a leadframe device 190.

Step 1320 includes receiving a circuit 120 such as a semiconductor chip substrate. The semiconductor chip substrate can include a first array of switch circuits 210 (e.g., tiles) disposed adjacent and parallel to a second array of switch circuits 210 (e.g., tiles). By way of a non-limiting example, source nodes in switch circuits of the first array are disposed adjacent (e.g., next to) and substantially parallel to source nodes in switch circuits of the second array. In one embodiment, the row of source nodes in the first array and the row of source nodes in the second array are disposed on the semiconductor chip substrate between a row of drain nodes of the first array and a row of drain nodes of the second array.

Step 1330 includes aligning the source nodes of the first circuit array and the source nodes of the second circuit array over a single conductive path such as the second conductive strip.

Step 1340 includes electrically coupling each of the source nodes in switch circuits of the first array and each of the source nodes in switch circuits of the second array to the second conductive strip.

Step 1350 includes electrically coupling each of the drain nodes in switch circuits 210 of the first array to the first conductive strip.

Step 1360 includes electrically coupling each of the drain nodes in switch circuits of the second array to the third conductive strip.

Step 1370 includes mounting a leadframe package or device including the first conductive strip, second conductive strip, and third conductive strip to a host circuit board to electrically couple the first conductive strip and the third conductive strip to each other. In one embodiment, the second conductive strip is electrically isolated from the first conductive strip and the third conductive strip.

Figure 14:
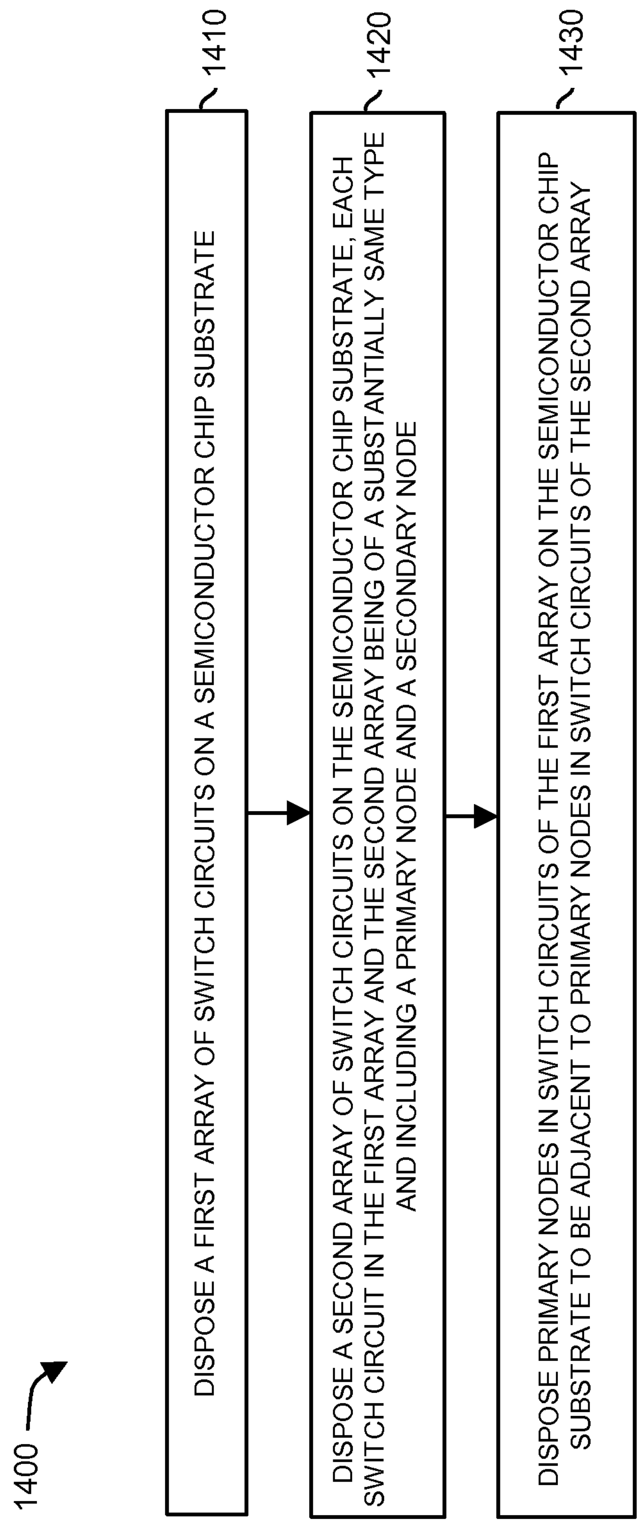

FIG. 14 is a flowchart 1400 illustrating an example method of creating an electrical circuit 120 according to embodiments herein. Note that there will be some overlap with respect to concepts as discussed above. In one embodiment, the steps in FIG. 14 are performed by one or more manufacturing facilities, machines, handlers, etc., that produce circuits 120.

Step 1410 includes disposing a first array of switch circuits on a circuit 120 such as a semiconductor chip substrate.

Step 1420 includes disposing a second array of switch circuits on the semiconductor chip substrate. Each switch circuit in the first array and the second array can be of a substantially same type and include a primary node (e.g., a source node) and a secondary node (e.g., a secondary node).

Step 1430 includes disposing primary nodes in switch circuits of the first array on the semiconductor chip substrate to be adjacent to primary nodes in switch circuits of the second array.

Figure 15:
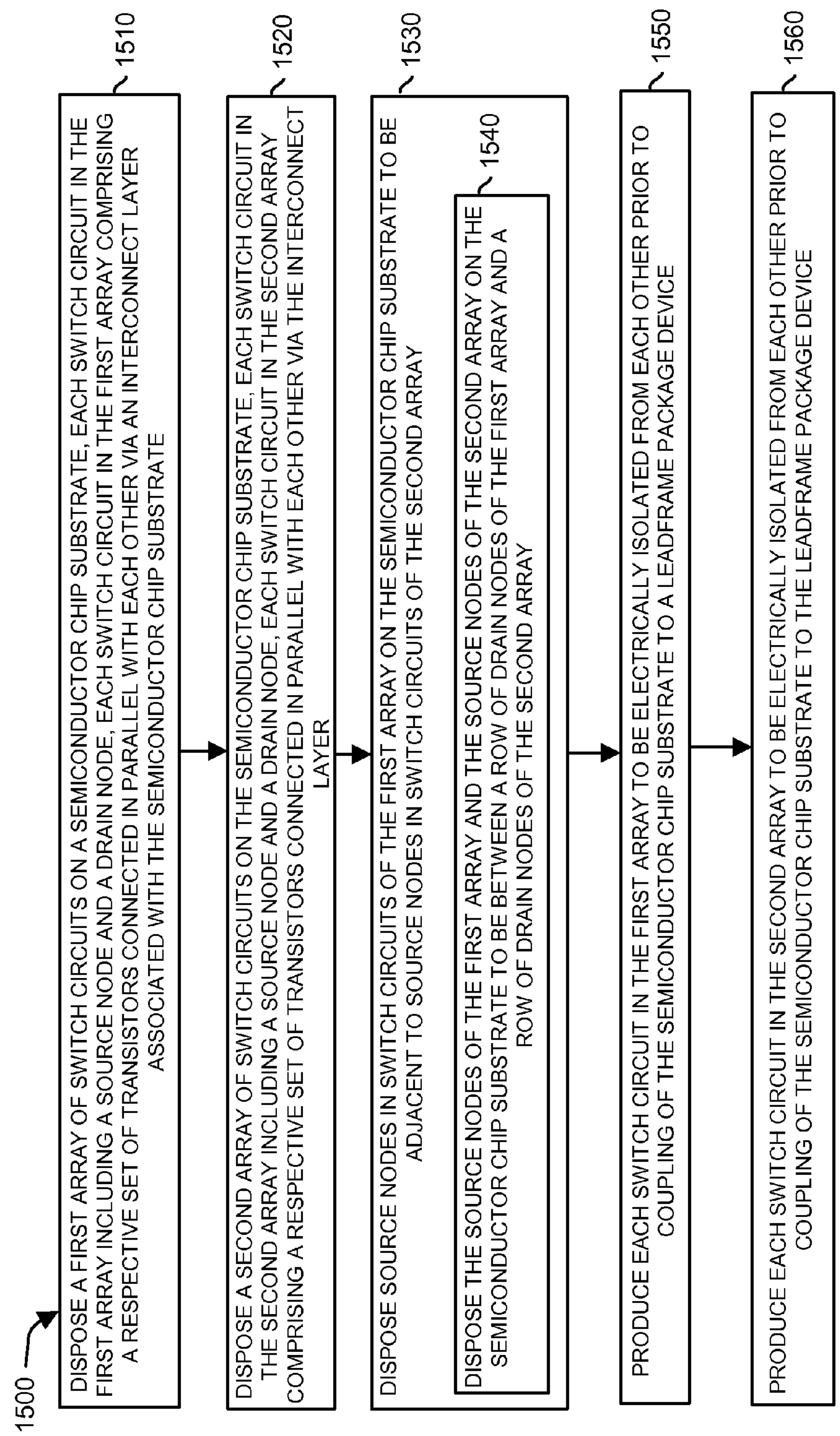

FIG. 15 is a flowchart 1500 illustrating an example method of creating an electrical circuit 120 according to embodiments herein. Note that there will be some overlap with respect to concepts as discussed above. In one embodiment, the steps in FIG. 15 are performed by one or more manufacturing facilities, machines, handlers, etc., that produce circuits.

Step 1510 includes disposing a first array of switch circuits 210 on a circuit such as a semiconductor chip substrate. Each switch circuit 210 in the first array includes a primary node such as a source node and a secondary node such as a drain node. Each switch circuit 210 in the first array comprises a respective set of transistors connected in parallel with each other via an interconnect layer associated with the semiconductor chip substrate.

Step 1520 includes disposing a second array of switch circuits 210 on the semiconductor chip substrate. Each switch circuit 210 in the second array includes a source node and a drain node. Each switch circuit in the second array comprises a respective set of transistors connected in parallel with each other via the interconnect layer.

Step 1530 includes disposing source nodes in switch circuits of the first array on the semiconductor chip substrate to be adjacent to source nodes in switch circuits of the second array. Sub-step 1540 includes disposing the source nodes of the first array and the source nodes of the second array on the semiconductor chip substrate to be between a row of drain nodes of the first array and a row of drain nodes of the second array.

Step 1550 includes producing each switch circuit 210 in the first array to be electrically isolated from each other prior to coupling of the switch circuits 210 in the semiconductor chip substrate to conductive paths 140 in a leadframe device 190.

Step 1560 includes producing each switch circuit 210 in the second array to be electrically isolated from each other prior to coupling of switch circuits 210 in the semiconductor chip substrate to the leadframe device 190.

Figure 16:
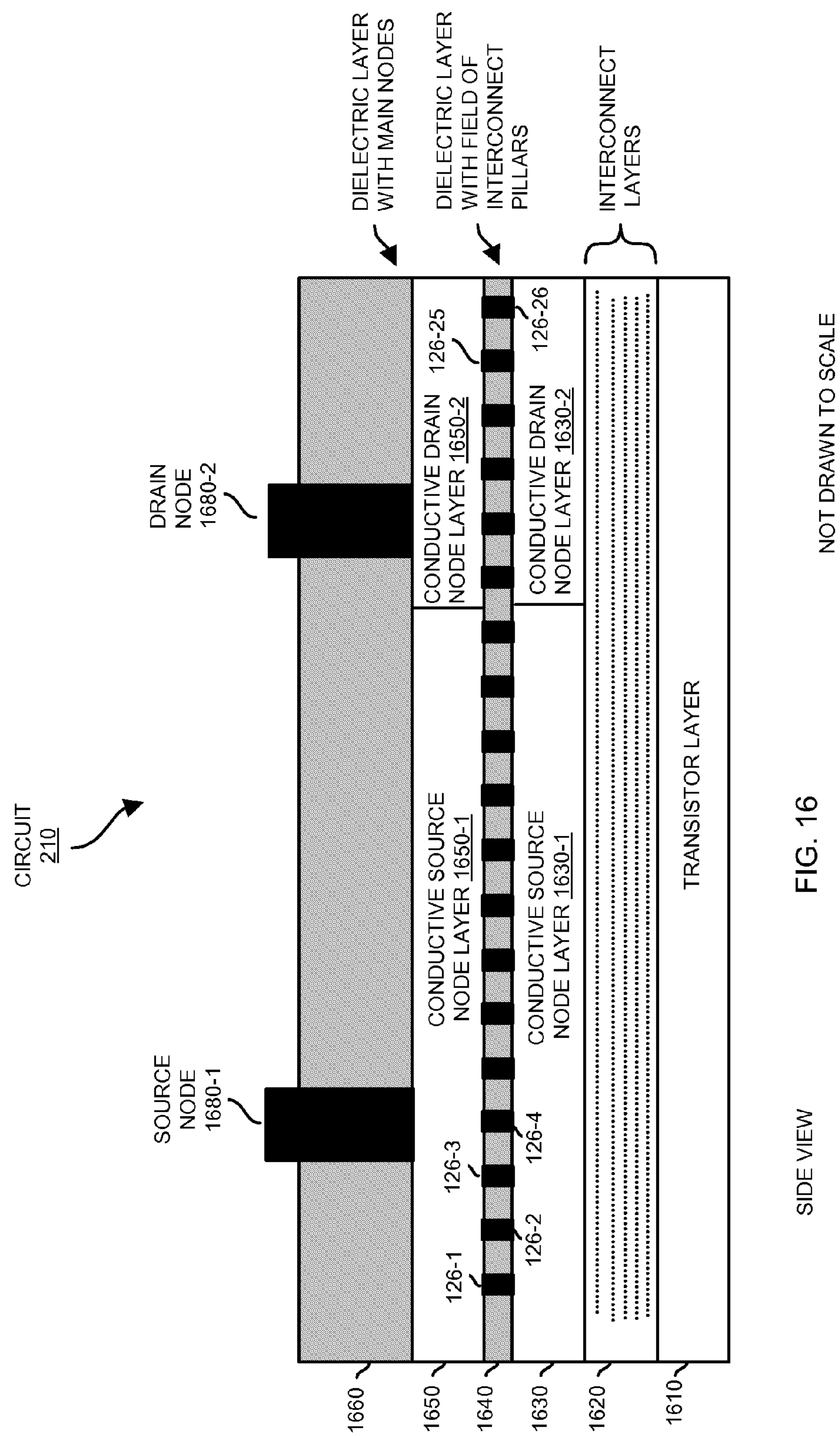
FIG. 16 is an example side view diagram illustrating layering in a circuit according to embodiments herein.

FIG. 16 is an example diagram illustrating layering and fabrication of a circuit 210 according to embodiments herein. Note that the thickness of each layer with respect to others is not necessarily drawn to scale.

As previously discussed, circuit 210 can be an integrated circuit device. In this example embodiment, circuit 210 includes a transistor layer 1610 (e.g., a semiconductor layer). Such a layer can include hundreds, thousands, millions, . . . of individual transistors such as field effect transistors, bipolar junction transistors, etc.

According to one embodiment, one or more interconnect layers 1620 (e.g., so-called metalization layers) in circuit 210 connect the transistors in parallel.

Transistors in the transistor layer 1610 can be electrically connected to conductive layer 1630 via interconnect layer 1620. Conductive layer 1630 can be electrically divided into different portions. For example, a first portion of conductive layer 1630 (e.g., conductive source node layer 1630-1) can be a first common circuit node of the multiple transistors connected in parallel with each other; a second portion of the conductive layer 1630 (e.g., conductive drain node layer 1630-2) can be a second common circuit node of the multiple transistors connected in parallel with each other.

In one embodiment, a source node of each transistor in the transistor layer 1610 is electrically coupled to conductive source node layer 1630-1 via the interconnect layer 1620. A drain node of each transistor in the transistor layer 1610 is electrically coupled to conductive drain node layer 1630-2 via the interconnect layer 1620. Although they reside in the same layer, the conductive source node layer 1630-1 is electrically isolated from the conductive drain node layer 1630-2.

As will be discussed later in this specification, a set of transistors in the transistor layer 1610 resides beneath the conductive source node layer 1630-1. Another set of transistors in the transistor layer 1610 resides beneath the conductive drain node layer 1630-2.

For a transistor residing beneath a region of the conductive source node layer 1630-1, a relatively short circuit path (e.g., a substantially vertical path) in the interconnect layer 1620 can connect the source node of the respective transistor to the conductive source node layer 1630-1. A longer circuit path in the interconnect layer 1620 is needed to connect the drain node of the respective transistor to the conductive drain node layer 1630-2 because such a circuit path must traverse horizontally in the interconnect layer 1620 from the respective transistor and up to the conductive drain node layer 1630-2.

For a transistor residing beneath a region of the conductive drain node layer 1630-2, a relatively short circuit path (e.g., a substantially vertical path) in the interconnect layer 1620 can connect the drain node of the respective transistor to the conductive drain node layer 1630-2. A longer circuit path is needed to connect the source node of the respective transistor to the conductive source node layer 1630-1 because such a circuit path must traverse horizontally in the interconnect layer 1620 from the respective transistor and up to the conductive source node layer 1630-1.

Dielectric layer 1640 such as a non-conductive material resides over conductive layer 1630. Dielectric layer 1640 can include a field of conductive interconnect links (e.g., conductive elements such as pillar 126-1, pillar 126-2, pillar 126-3, pillar 126-4, . . . , pillar 126-25, pillar 126-26, . . . ). Each link extends through the dielectric layer 1640 to connect conductive layer 1630 to conductive layer 1650. By way of a non-limiting example, successive pillars 126 can be spaced apart from each other by 60 micrometers in a grid like manner. Each pillar 126 can be of a diameter as 20 micrometers. However, note that these dimensions can vary depending on the application.

More specifically, a first set of pillars 126 or contact elements in dielectric layer 1640 electrically connect conductive source node layer 1630-1 to conductive source node layer 1650-1. A second set of pillars 126 or contact elements in dielectric layer 1640 electrically connect conductive drain node layer 1630-1 to conductive drain node layer 1650-1. Accordingly, via the first set of links in the dielectric layer 1640, the conductive source node layer 1630-1 is electrically connected to the conductive source node layer 1650-1. Via the second set of pillars in the dielectric layer 1640, the conductive drain node layer 1630-2 is electrically connected to the conductive drain node layer 1650-2.

In one embodiment, the pillars 162 are links made from a metal such as copper to provide connectivity between conductive layer 1630 and conductive layer 1650.

By way of a non-limiting example, conductive layer 1630 can be fabricated from a conductive material such as a first type of metal. Conductive layer 1650 can be fabricated from a second type of metal.

In a specific embodiment, the conductive layer 1630 is made from aluminum and the conductive layer 1650 is made from copper. Copper has a lower resistivity than aluminum. Said differently, copper is a better conductor of electricity than aluminum.

In general, fabricating conductive layer 1650 with a conductive material having a relatively lower resistivity (than a resistivity of conductive layer 1630) reduces an overall thickness of the circuit 210. For example, by way of a non-limiting example, the conductive layer 1630 can be formed from (approximately) a 3-micrometer layer of aluminum. Conductive layer 1650 can be formed from (approximately) a 6-micrometer layer of aluminum as well. However, forming conductive layer 1650 based on copper (instead of aluminum) can reduce an overall thickness of the circuit 210. That is, because copper has a higher conductivity (e.g., lower resistivity) than aluminum, forming conductive layer 1650 based on a material such as copper (e.g., 3 micrometers) can reduce an overall thickness of circuit 210 without negatively impacting characteristics of the device. In other words, a 3 micrometer layer of copper in layer 1650 can provide a relatively comparable low resistive path as would a 6 micrometer layer of aluminum. Thus, according to one embodiment, utilizing 3 micrometers of copper instead of a 6 micrometer thickness of aluminum reduces a thickness of the circuit by 3 micrometers.

Layer 1660 includes source node 1680-1 and drain node 1680-2 providing connectivity between the conductive source node layer 1650 and respective conductive path 140 in leadframe device 190.

By way of a non-limiting example, in one embodiment, the source node 1680-1 and drain node 1680-2 can be 100 micrometers tall and have a diameter of approximately 85 micrometers. However, note that the source node 1680-1 and drain node 1680-2 of circuit 210 can vary depending on the application.

Figure 17:
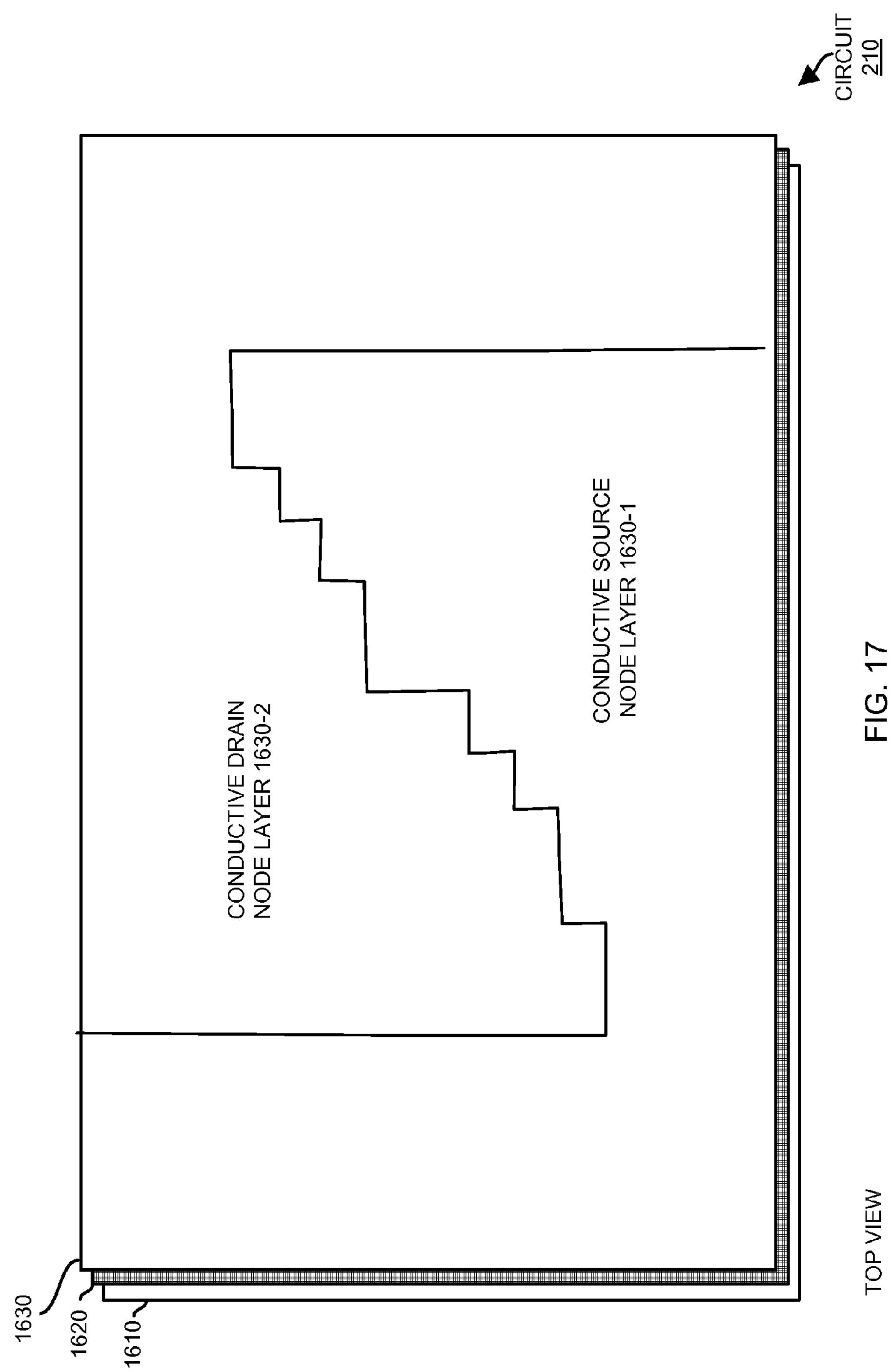
FIG. 17 is an example top view diagram illustrating layering in circuit according to embodiments herein.

FIG. 17 is an example diagram illustrating a top view of a fabricated circuit 210 (e.g., tile region associated with circuit 120) according to embodiments herein. By way of a non-limiting example, the circuit 210 can be 500 micrometers wide and 1000 micrometers long. However, circuit 210 can be any suitable dimensions.

As shown, circuit 210 includes conductive layer 1630 disposed over interconnect layer 1620. Interconnect layer 1620 connects nodes associated with transistors in transistor layer 1610 to the conductive layer 1630. For example, as previously discussed, the interconnect layer 1620 connects a source node of each transistor in the transistor layer 1610 to conductive source node layer 1630-1. The interconnect layer 1620 connects a drain node of each transistor in the transistor layer 1610 to conductive drain node layer 1630-2.

In one embodiment, the conductive layer 1630 is partitioned as shown such that each transistor connected in parallel has similar operating characteristics.

As discussed above with respect to FIG. 7, the multiple transistors in circuit 210 (or tile) can be interconnected in such a way that the impedance of interconnect paths for each transistor are reasonably matched with each of the other transistors in electrical circuit 210-1. In other words, for any given transistor residing in the transistor layer 1610, a source of the transistor can be connected to the conductive source node layer 1630-1 and the drain can be connected to the conductive drain node layer 1630-2 such that the total resistance or impedance of an interconnect path including a first interconnect leg from a source node of the given transistor to the conductive source node layer 1630-1 plus a second interconnect leg from a drain node of the given transistor to the conductive drain is within a tolerance such as 20% with respect to the same measured impedance of other transistors. Thus, by way of a non-limiting example, the resistance of legs of the interconnect paths can be within a nominal value +/−10 percent such that each transistor in a tile has approximately the same operating characteristics.

Providing balanced path impedance interconnectivity in this manner is useful because the burden of providing isolation/coupling is more equally shared amongst the transistors 520. Thus, no single one or group of transistors in the transistor layer 1620 is unduly stressed as a result of high current sinking or sourcing conditions.

Figure 18:
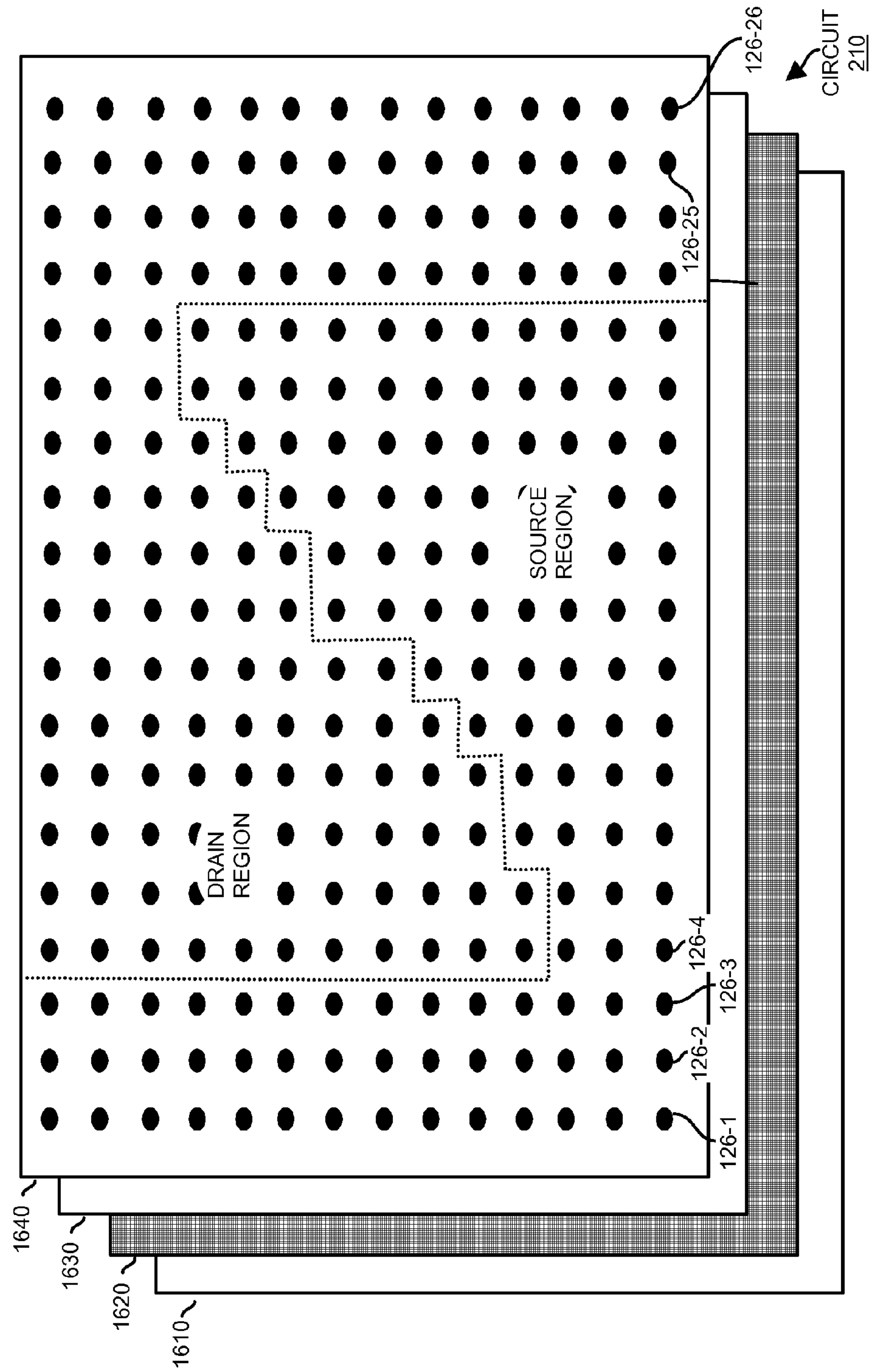
FIG. 18 is an example top view diagram illustrating layering in circuit according to embodiments herein.

FIG. 18 is an example diagram illustrating a top view of the field of conductive elements 126 disposed in layer 1640 according to embodiments herein. As previously discussed, the field of conductive elements 126 in the source region provides connectivity between conductive source node layer 1630-1 and conductive source node layer 1650-1. The field of conductive elements 126 in the drain region provides connectivity between conductive drain node layer 1630-2 and conductive source node layer 1650-2.

Figure 19:
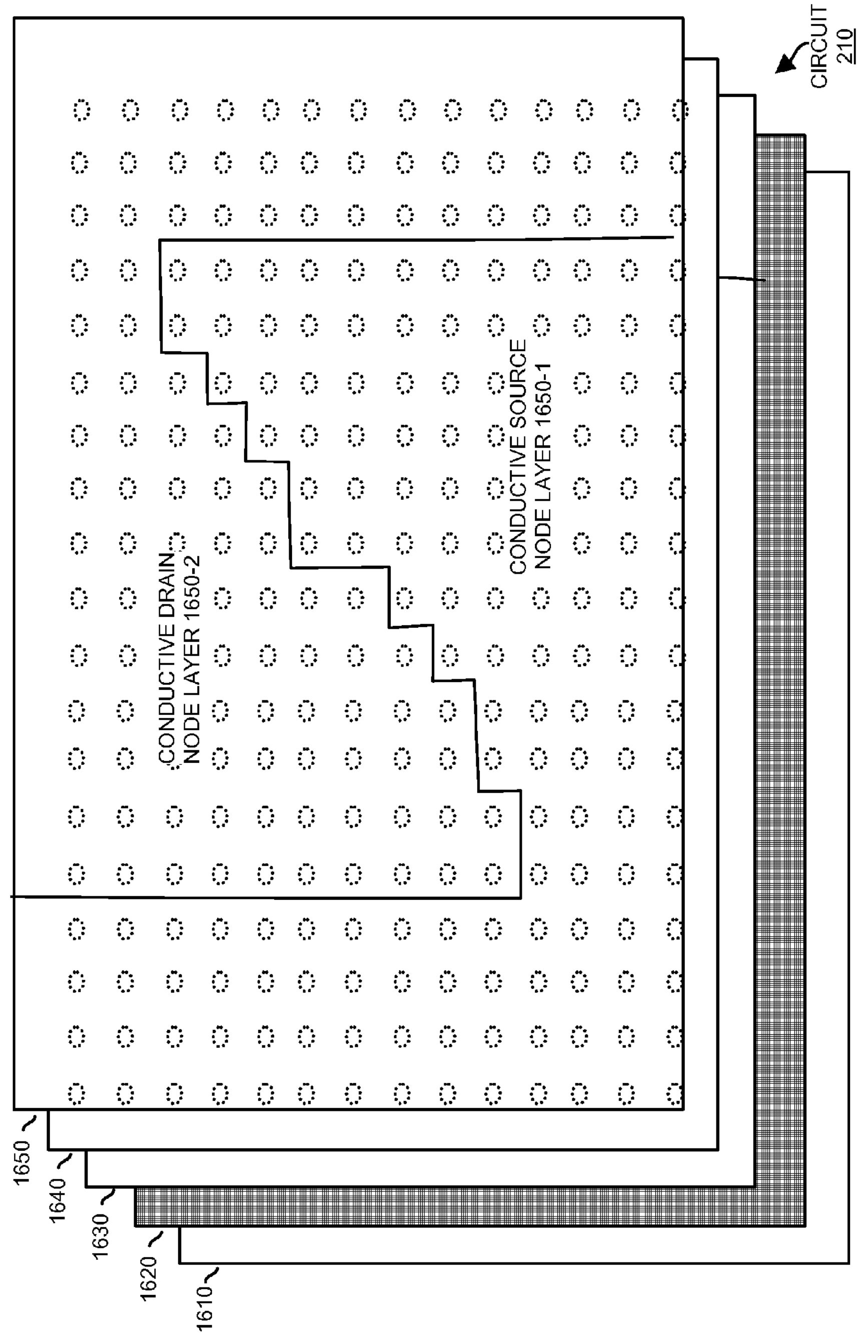
FIG. 19 is an example top view diagram illustrating layering in circuit according to embodiments herein.

FIG. 19 is an example diagram illustrating a top view of conductive layer 1650 according to embodiments herein. As previously discussed, the conductive source node layer 1650-1 is electrically isolated from conductive drain node layer 1650-2. That is, a first portion of the conductive layer 1650 represents a source node of multiple transistors in parallel; a second portion of the conductive layer 1650 represents a drain node of multiple transistors in parallel.

Figure 20:
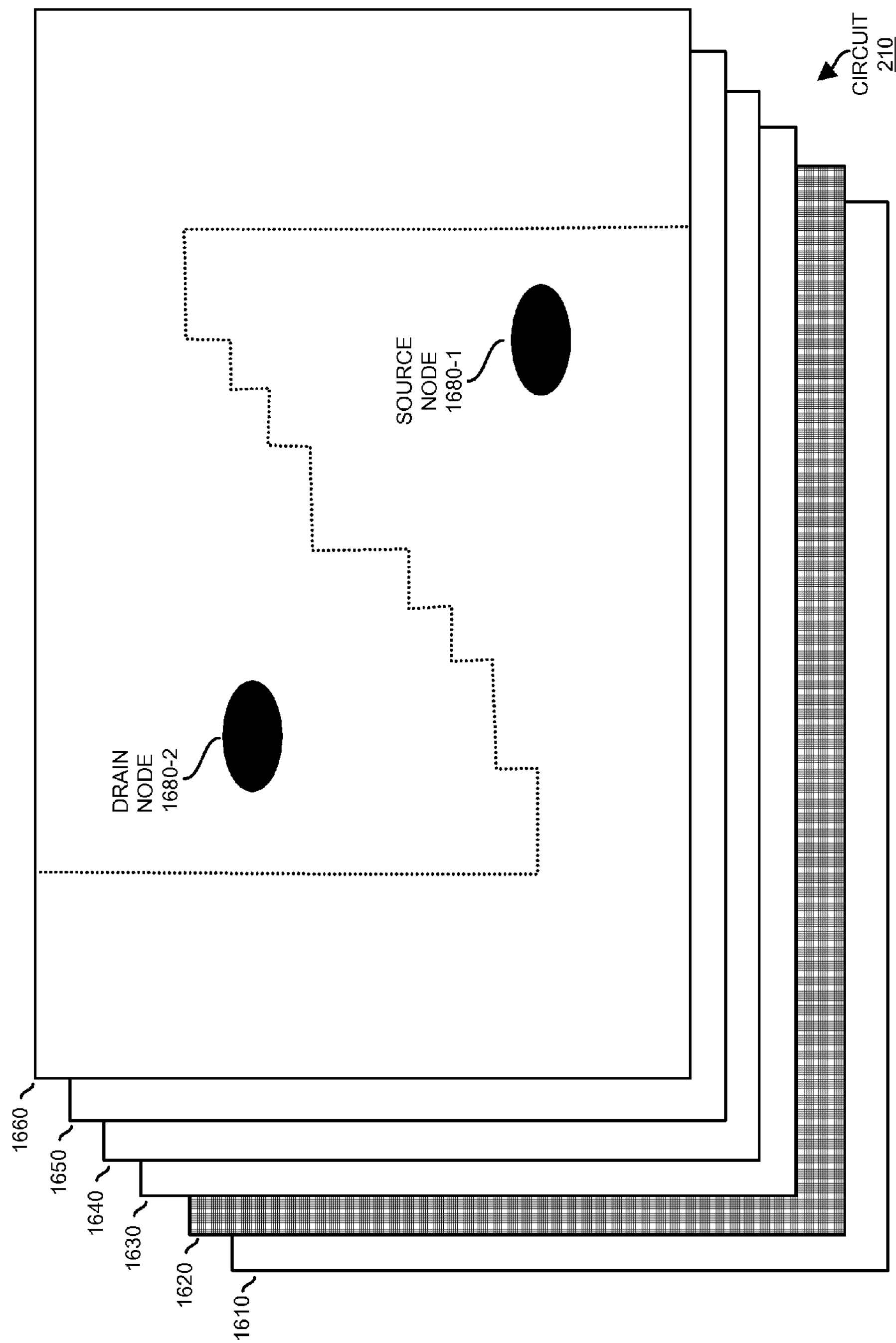
FIG. 20 is an example top view diagram illustrating layering in circuit according to embodiments herein.

FIG. 20 is an example diagram illustrating a top view of layer 1660 according to embodiments herein.

As shown, the dielectric layer 1660 can be an electrically non-conductive material. Source node 1680-1 extends through the conductive layer 1660 to conductive source node layer 1650-1. Drain node 1680-2 extends through the conductive layer 1660 to conductive drain node layer 1650-2.

In one embodiment, the source node 1680-1 and drain node 1680-2 are conductive pillars made from copper. However, the source node 1680-1 and drain node 1680-2 can be any suitable type of electrically conductive material or shape such as a solder ball. By way of a non-limiting example, in one embodiment, the source node 1680-1 and drain node 1680-2 can be space approximately 550 micrometers apart from each other. However, note that this dimension can vary depending on the application.

As previously discussed, the source node 1680-1 can be electrically coupled to a respective conductive path 140 or conductive strip in the leadframe device 190. In such an embodiment, each of the transistors in the transistor layer 1610 can be electrically connected to a respective conductive path 140 in the leadframe device 190 via a series of connectivity paths through a combination of the interconnect layer 1620, the conductive source node layer 1650-1, the field of conductive field elements 126 in the source region, the conductive source node layer 1650-1, and the source node 1680-1.

As previously discussed, the source node 1680-2 can be electrically coupled to a respective conductive path 140 in the leadframe device 190. In such an embodiment, transistors in the transistor layer 1610 can be electrically connected to a respective conductive path 140 or conductive strip in the leadframe device 190 via a series of connectivity paths through a combination of the interconnect layer 1620, conductive drain node layer 1650-2, field of conductive field elements 126 in the drain region, conductive drain node layer 1650-2, and drain node 1680-2.

Figure 21:
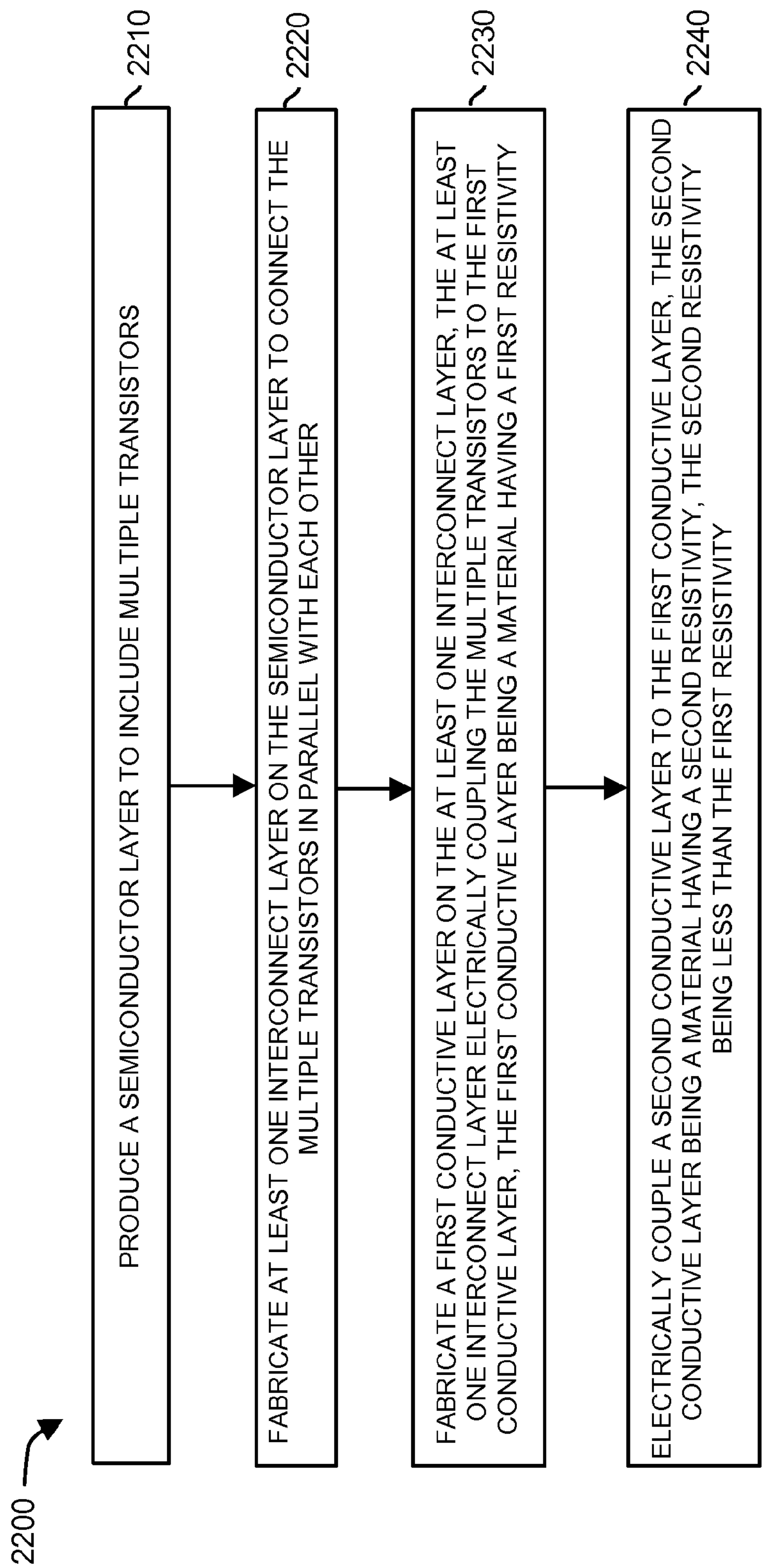
FIGS. 21-23 are flowcharts illustrating example methods of creating a circuit according to embodiments herein.
Figure 22:
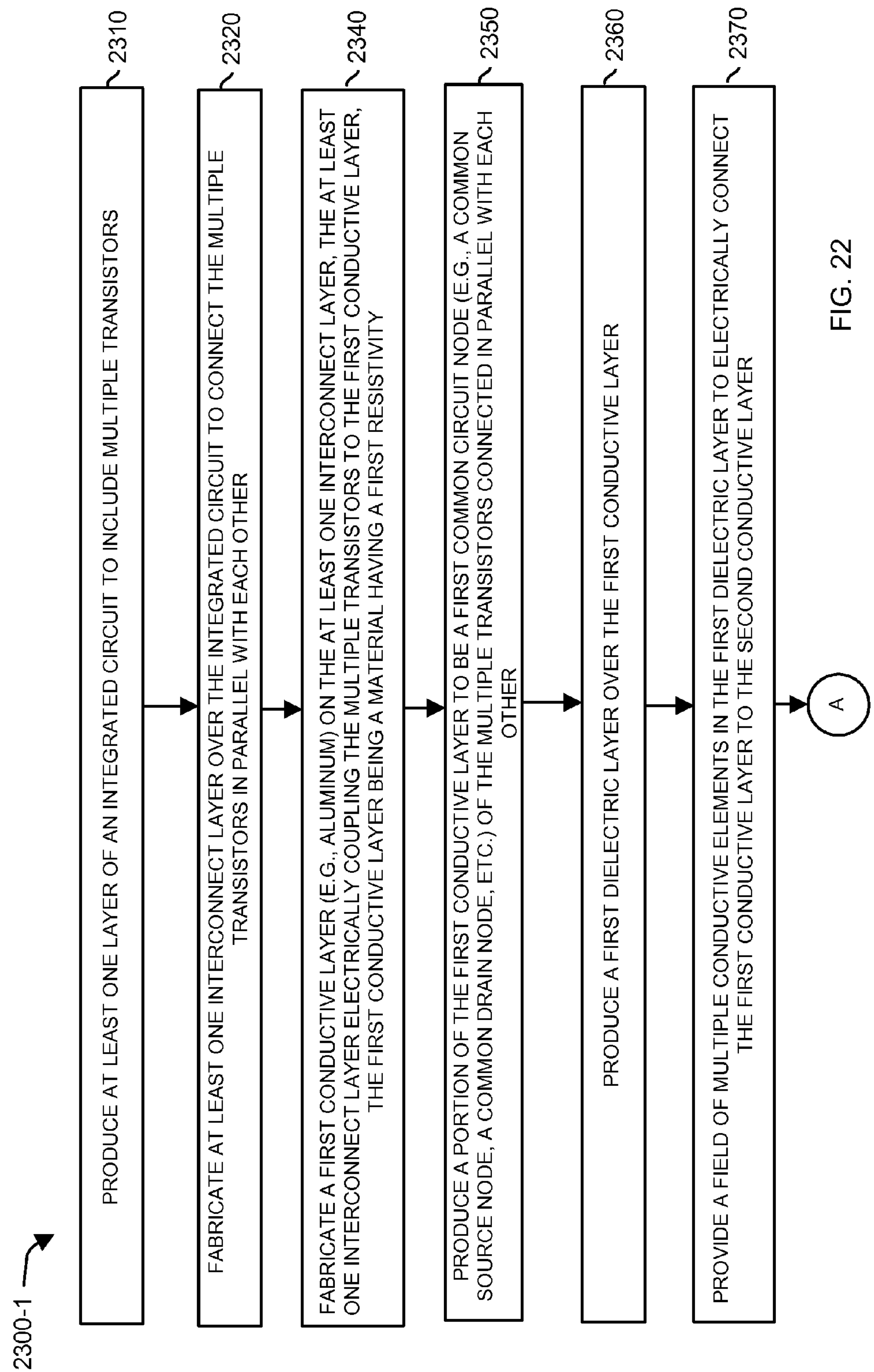

FIG. 21 is a flowchart 2200 illustrating an example method of creating circuit 210 via different layers according to embodiments herein. Note that there will be some overlap with respect to concepts as discussed above. In one embodiment, the steps in FIG. 22 are performed by one or more manufacturing facilities, machines, handlers, etc., that produce circuits 120 and/or circuits 210.

Step 2210 includes producing a transistor layer 1610 (e.g., semiconductor layer, circuit layer, etc.) to include multiple transistors.

Step 2220 includes fabricating one or more interconnect layers 1620 on the transistor to connect the multiple transistors in parallel with each other.

Step 2230 includes fabricating a conductive layer 1630 on the one or more interconnect layers 1620. The one or more interconnect layer 1620 electrically couples multiple transistors in the transistor layer to the conductive layer 1630. The conductive layer 1620 can be a first type of material having a first resistivity.

Step 2240 includes electrically coupling conductive layer 1650 to conductive layer 1650. The conductive layer 1650 can be a second type of material having a second resistivity. In one embodiment, the second resistivity is less than the first resistivity.

Figure 23:
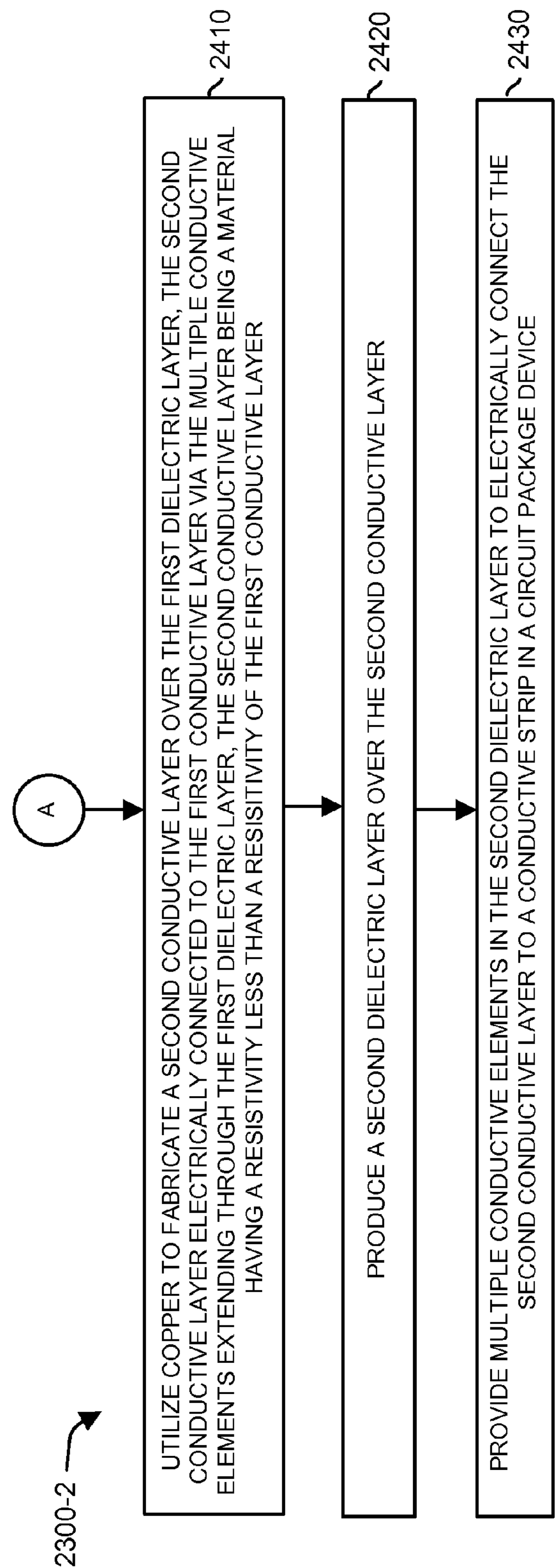

FIGS. 22 and 23 combine to form a flowchart 2300 (e.g., flowchart 2300-1 and 2300-2) illustrating an example method of creating circuit 210 according to embodiments herein. Note that there will be some overlap with respect to concepts as discussed above. In one embodiment, the steps in flowchart 2300 are performed by one or more manufacturing facilities, machines, handlers, etc., that produce circuits 120 and/or circuits 210.

Step 2310 includes producing one or more transistor layers 1610 (e.g., integrated circuit layers) to include multiple transistors.

Step 2320 includes fabricating one or more interconnect layers 1620 over the transistor layer 1610 to connect the multiple transistors in parallel with each other. In one embodiment, sets of the multiple transistors are independent of each other until the source and drain nodes are connected to the conductive layer 1630. In such an embodiment, the sets of transistors are connected in parallel with each other after the nodes are connected to the conductive layer 1630.

Step 2340 includes fabricating a first conductive layer 1630 such as aluminum on the at least one interconnect layer 1620. The interconnect layer(s) 1620 electrically couple the multiple transistors in the transistor layer 1610 to the conductive layer 1630. By way of a non-limiting example, the conductive layer 1630 is a material such as aluminum having a first resistivity.

Step 2350 includes producing a portion of the conductive layer 1630 to be a common circuit node (e.g., a common source node, a common drain node, etc.) of the multiple transistors connected in parallel with each other.

Step 2360 includes producing a dielectric layer 1640 over the conductive layer 1630.

Step 2370 includes providing a field of conductive elements 126 in the dielectric layer 1640. As discussed below, the conductive elements 126 in the dielectric layer 1640 will electrically connect the conductive layer 1630 to the conductive layer 1650.

Step 2410 in FIG. 23 includes utilizing a metal such as copper to fabricate conductive layer 1650 over the dielectric layer 1640. The conductive layer 1650 is electrically connected to conductive layer 1650 via the multiple conductive elements 126 extending through the dielectric layer 1640. By way of a non-limiting example, in one embodiment, the conductive layer 1650 is a material having a resistivity less than a resisitivity of material used to form the conductive layer 1630.

Step 2420 includes producing a dielectric layer 1660 over the conductive layer 1650.

Step 2430 includes providing multiple conductive elements (e.g., a source node 1680-1 and a drain node 168-2) in dielectric layer 1660 to electrically connect conductive layer 1650 to a conductive path 140 (e.g., conductive strip of metal) in a respective circuit package device.

Note again that techniques herein are well suited for use in packaging electronic parts such as those that provide switching capabilities. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. An integrated circuit device comprising:

a semiconductor layer including multiple transistors;

multiple interconnect layers connecting the multiple transistors in parallel;

a first conductive layer electrically coupled to the multiple transistors via the multiple interconnect layers, the first conductive layer being a material having a first resistivity;

a second conductive layer electrically coupled to the first conductive layer, the second conductive layer being a material having a second resistivity, the second resistivity being less than the first resistivity; and the first conductive layer disposed between the semiconductor layer and the second conductive layer, the first conductive layer providing electrical connectivity between the multiple transistors connected in parallel and the second conductive layer;

wherein a first portion of the first conductive layer is a first common circuit node of the multiple transistors connected in parallel with each other;

wherein a second portion of the first conductive layer is a second common circuit node of the multiple transistors connected in parallel with each other;

wherein the first portion of the first conductive layer and the second portion of the first conductive layer are electrically isolated from each other;

wherein a first portion of the second conductive layer is electrically coupled to the first portion of the first conductive layer;

wherein a second portion of the second conductive layer is electrically coupled to the second portion of the first conductive layer;

wherein the first portion of the second conductive layer and the second portion of the second conductive layer are electrically isolated from each other;

a dielectric layer disposed between the first conductive layer and the second conductive layer;

a first field of multiple spaced conductive elements disposed in the dielectric layer to electrically connect the first portion of the first conductive layer to the first portion of the second conductive layer;

a second field of multiple spaced conductive elements disposed in the dielectric layer to electrically connect the second portion of the first conductive layer to the second portion of the second conductive layer;

wherein the multiple interconnect layers electrically connect a respective source node of each of the multiple transistors in the semiconductor layer to the first portion of the first conductive layer;

wherein the multiple interconnect layers electrically connect a respective drain node of each of the multiple transistors in the semiconductor layer to the second portion of the first conductive layer;

wherein a combination of the second conductive layer, the first conductive layer, and the multiple transistors form a stack;

wherein the first portion of the second conductive layer resides over the first portion of the first conductive layer, a first portion of the multiple transistors residing in the stack beneath the first portion of the first conductive layer; and wherein the second portion of the second conductive layer resides over the second portion of the first conductive layer, a second portion of the multiple transistors residing in the stack beneath the first portion of the first conductive layer.

2. The integrated circuit device as in claim 1, wherein the first conductive layer is aluminum and the second conductive layer is copper.

3. The integrated circuit device as in claim 1 further comprising:

a leadframe package, the leadframe package including a first conductive strip and a second conductive strip disposed in parallel;

a first conductive contact providing electrical connectivity between the first portion of the second conductive layer and the first conductive strip; and a second conductive contact providing electrical connectivity between the second portion of the second conductive layer and the second conductive strip.

4. The integrated circuit device as in claim 1, wherein the first portion of the first conductive layer resides adjacent to the second portion of the first conductive layer; and wherein the first portion of transistors resides adjacent to the second portion of the transistors in the semiconductor layer.

* * * * *